United States Patent
Sekizawa et al.

(10) Patent No.: US 9,590,623 B2
(45) Date of Patent: Mar. 7, 2017

(54) TOUCH PANEL AND METHOD OF DETECTING POSITION

(71) Applicant: FUJITSU COMPONENT LIMITED, Tokyo (JP)

(72) Inventors: Mitsuhiro Sekizawa, Tokyo (JP); Satoshi Sakurai, Tokyo (JP); Nobuyoshi Shimizu, Tokyo (JP); Shigemi Kurashima, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 122 days.

(21) Appl. No.: 14/457,164

(22) Filed: Aug. 12, 2014

(65) Prior Publication Data
US 2014/0346029 A1    Nov. 27, 2014

Related U.S. Application Data

(63) Continuation of application No. PCT/JP2013/053086, filed on Feb. 8, 2013.

(30) Foreign Application Priority Data

Feb. 15, 2012 (JP) ................................. 2012-031101
Feb. 15, 2012 (JP) ................................. 2012-031102
Feb. 24, 2012 (JP) ................................. 2012-039313

(51) Int. Cl.
*G06F 3/045* (2006.01)
*H03K 17/96* (2006.01)
(Continued)

(52) U.S. Cl.
CPC ......... *H03K 17/9622* (2013.01); *G06F 3/044* (2013.01); *G06F 3/045* (2013.01);
(Continued)

(58) Field of Classification Search
USPC ......................................................... 200/600
See application file for complete search history.

(56) References Cited

U.S. PATENT DOCUMENTS 6,744,202 B2 *  6/2004  Okigawa ............... H01J 11/12
                                                    313/492
2001/0013855 A1  8/2001  Fricker et al.
(Continued)

FOREIGN PATENT DOCUMENTS

EP          1811364           7/2007
JP          H03-291714        12/1991
(Continued)

OTHER PUBLICATIONS

International Search Report mailed on Apr. 23, 2013.

*Primary Examiner* — Renee Luebke
*Assistant Examiner* — Ahmed Saeed
(74) *Attorney, Agent, or Firm* — IPUSA, PLLC

(57) ABSTRACT

A touch panel includes a first conductive film having separate areas, each of which has a strip shape with a length direction thereof extending in a first direction, a second conductive film having separate areas, each of which has a strip shape with a length direction thereof extending in a second direction substantially perpendicular to the first direction, and a third conductive film, wherein the separate areas of the first conductive film are arranged side by side in the second direction, and the separate areas of the second conductive film are arranged side by side in the first direction, wherein position detection based on a capacitive method is performed by using the first conductive film and the second conductive film, and wherein a potential of a position of contact between the second conductive film and the third conductive film is detected to detect the position of the contact.

11 Claims, 30 Drawing Sheets

(51) Int. Cl.
*G06F 3/044* (2006.01)
*G06F 3/041* (2006.01)

(52) U.S. Cl.
CPC ....... *G06F 3/0416* (2013.01); *H03K 17/9647* (2013.01); *G06F 2203/04106* (2013.01); *G06F 2203/04107* (2013.01); *H03K 2017/9615* (2013.01); *H03K 2217/960755* (2013.01)

(56) References Cited

U.S. PATENT DOCUMENTS

| | | |
|---|---|---|
| 2005/0139398 A1 | 6/2005 | Endo |
| 2008/0231607 A1 | 9/2008 | Utsunomiya et al. |
| 2009/0096762 A1 | 4/2009 | Hinata |
| 2010/0026660 A1 | 2/2010 | Kitamura |
| 2010/0283762 A1 | 11/2010 | Takusa |
| 2011/0018826 A1* | 1/2011 | Shoji ................ G06F 3/044 345/173 |
| 2011/0181545 A1 | 7/2011 | Takahashi et al. |
| 2011/0199324 A1 | 8/2011 | Wang et al. |
| 2011/0234508 A1 | 9/2011 | Oda et al. |
| 2011/0248728 A1 | 10/2011 | Maruyama |
| 2012/0007825 A1 | 1/2012 | Kim et al. |
| 2012/0007828 A1 | 1/2012 | Mizuhashi et al. |
| 2012/0086668 A1 | 4/2012 | Wang et al. |
| 2013/0021089 A1* | 1/2013 | Sakurai ............... G06F 3/044 327/517 |
| 2013/0127777 A1 | 5/2013 | Yang |
| 2014/0028586 A1* | 1/2014 | Kurashima ........... G06F 3/0412 345/173 |
| 2014/0306930 A1 | 10/2014 | Wang et al. |

FOREIGN PATENT DOCUMENTS

| | | | |
|---|---|---|---|
| JP | H11-232023 | 8/1999 | |
| JP | 2004-272722 | 9/2004 | |
| JP | 2005-196280 | 7/2005 | |
| JP | 3132106 U | 5/2007 | |
| JP | 3139196 * | 1/2008 | ............ G06F 3/041 |
| JP | 3139196 U | 1/2008 | |
| JP | 2008-233315 | 10/2008 | |
| JP | 2008-293129 | 12/2008 | |
| JP | 3150179 U | 4/2009 | |
| JP | 2009-116849 | 5/2009 | |
| JP | 2009-129100 | 6/2009 | |
| JP | 2010-039602 | 2/2010 | |
| JP | 2010-079791 | 4/2010 | |
| JP | 2011-154442 | 8/2011 | |
| JP | 2011-209785 | 10/2011 | |
| JP | 2012-018619 | 1/2012 | |
| JP | 3173195 U | 1/2012 | |
| KR | 10-2011-0072573 | 6/2011 | |
| TW | 201128477 | 8/2011 | |
| WO | 2010/099678 | 9/2010 | |

\* cited by examiner

FIG.13
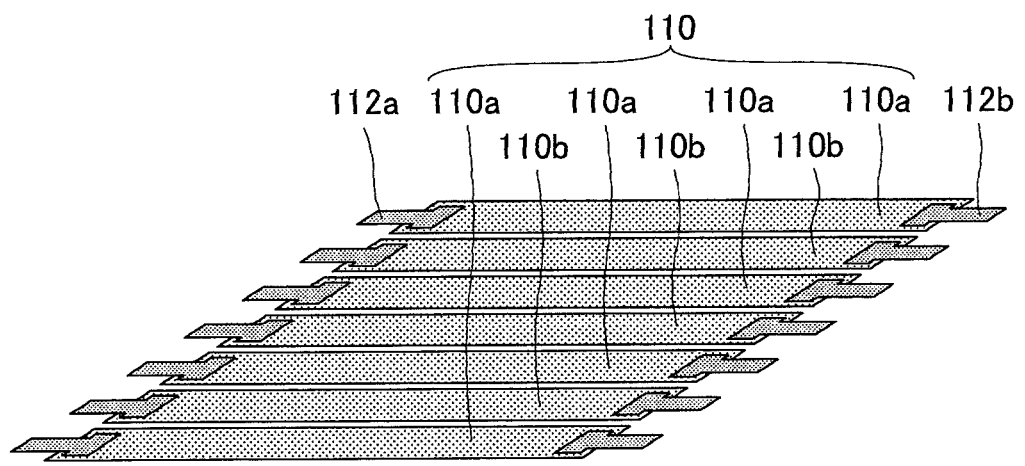
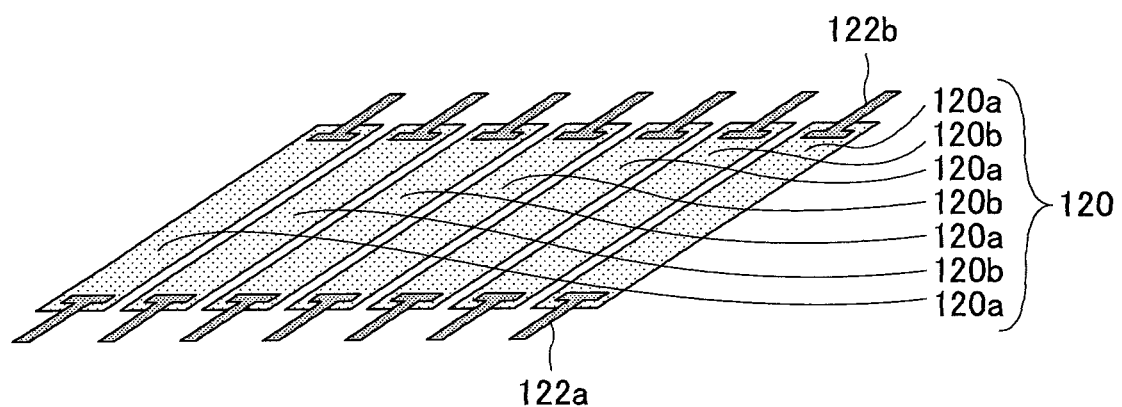
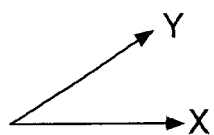

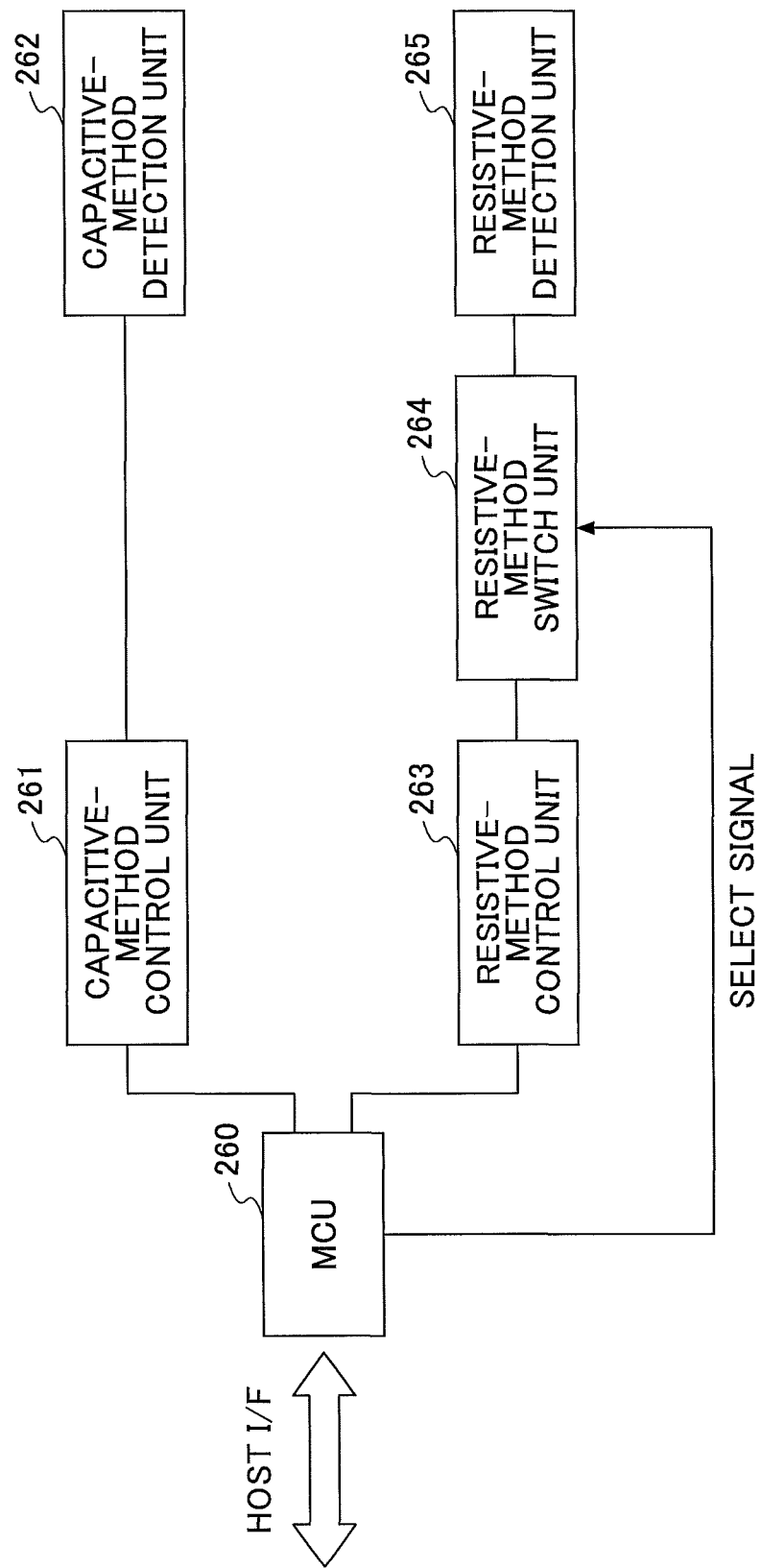

TOUCH PANEL AND METHOD OF DETECTING POSITION

CROSS-REFERENCE TO RELATED APPLICATIONS

The present application is a continuation application of International Application PCT/JP2013/053086 filed on Feb. 8, 2013 and designated the U.S., the entire contents of which are incorporated herein by reference.

BACKGROUND OF THE INVENTION

1. Field of the Invention

The disclosures herein relate to a touch panel and a method of detecting a position.

2. Description of the Related Art

A touch panel (i.e., touchscreen panel) is an input device that allows input to be made directly on a display screen, and is generally placed in front of the display screen. Touch panels are widely used in various applications because of their capability of allowing direct input based on visual information provided on the display screen.

A resistive-type touch panel and a capacitive-type touch panel are widely known in the art. The resistive-type touch panel includes an upper electrode substrate and a lower electrode substrate having respective transparent conductive films. These substrates are arranged such that the corresponding transparent conductive films face each other. When pressure is applied to a point on the upper electrode substrate, the transparent conductive films are brought into contact with each other, thereby allowing the position of the pressed point to be detected.

The resistive-type touch panel is classified into a four-wire type, a five-wire type, and a diode type. In the four-wire type, an X-axis electrode is disposed on one of the upper electrode substrate and the lower electrode substrate, and a Y-axis electrode is disposed on the other substrate (see Patent Document 1, for example). In the five-wire type, an X-axis electrode and a Y-axis electrode are both disposed on the lower electrode substrate while the upper electrode substrate serves as a probe for detecting voltage (see Patent Document 2, for example). In the diode type, diodes are disposed on the lower electrode substrate. Two electrodes for applying voltage and four electrodes for monitoring a potential are provided, and, also, an electrode serving as a probe for detecting voltage is provided on the upper electrode substrate. This type is also referred to as a seven-wire type because seven electrodes in total are formed (see Patent Document 3, for example).

The capacitive-type touch panel detects an electrical current as the current flows through a transparent electrode or the like in response to a finger or the like coming into the close proximity of the touch panel, thereby detecting the relevant position.

Further, a touch panel in which a resistive-type touch panel and a capacitive-type touch panel are stacked one over another is known, which utilizes respective characteristics of the resistive type and the capacitive type (see Patent Documents 4 and 5, for example).

The capacitive-type touch panel employs a capacitive-coupling-based detection mechanism, and, thus, can detect the position of a point that is touched, even in the absence of pressure being applied. Contact by an insulating object, however, cannot cause its contact position to be detected. The resistive-type touch panel does not require an object coming into contact with the touch panel to be made of any particular type of material. However, certain pressure needs to be applied to the touch panel because position detection is performed based on a physical contact between a transparent conductive film serving as an upper resistive film and a transparent conductive film serving as a lower resistive film.

Patent Documents 4 and 5 disclose a structure in which a capacitive-type touch panel and a resistive-type touch panel are stacked one over another, which have respective advantages of the capacitive-type touch panel and the resistive-type touch panel.

A touch panel having such a structure, however, gives rise to the problem of increased thickness and the problem of increased cost due to the provision of two types of touch panels stacked one over another.

Accordingly, there may be a need for a thin, low cost touch panel that has respective advantages of the capacitive-type touch panel and the resistive-type touch panel, i.e., a thin, low cost touch panel that allows position to be detected only upon a slight touch and that does not require a touching object to be made of a particular material. Further, there may be a need for a method of detecting a position in such a touch panel.

[Patent Document 1] Japanese Patent Application Publication No. 2004-272722
[Patent Document 2] Japanese Patent Application Publication No. 2008-293129
[Patent Document 3] Japanese Patent Application Publication No. 2005-196280
[Patent Document 4] Japanese Utility Model Registration No. 3132106
[Patent Document 5] Japanese Utility Model Registration No. 3139196
[Patent Document 6] Japanese Patent Application Publication No. 2009-116849

SUMMARY OF THE INVENTION

According to an embodiment, a touch panel includes a first conductive film having a plurality of separate areas, each of which has a strip shape with a length direction thereof extending in a first direction, a second conductive film having a plurality of separate areas, each of which has a strip shape with a length direction thereof extending in a second direction substantially perpendicular to the first direction, and a third conductive film, wherein the separate areas of the first conductive film are arranged side by side in the second direction, and the separate areas of the second conductive film are arranged side by side in the first direction, wherein position detection based on a capacitive method is performed by using the first conductive film and the second conductive film, and wherein a potential of a position of contact between the second conductive film and the third conductive film is detected to detect the position of the contact.

According to an embodiment, a touch panel includes a first substrate having first conductive films formed thereon, each of which has a strip shape with a length direction thereof extending in a first direction and has an electrode at one end thereof in the first direction, a second substrate having second conductive films formed thereon, each of which has a strip shape with a length direction thereof extending in a second direction perpendicular to the first direction, and has electrodes at opposite ends thereof in the second direction, and a third substrate having a third conductive film of a planar shape formed thereon, wherein the first substrate, the second substrate, and the third substrate are stacked one over another in the order named.

According to an embodiment, a method of detecting position in a touch panel is provided. The touch panel includes a first conductive film having a plurality of separate areas, each of which has a strip shape with a length direction thereof extending in a first direction; a second conductive film having a plurality of separate areas, each of which has a strip shape with a length direction thereof extending in a second direction substantially perpendicular to the first direction; and a third conductive film, wherein the separate areas of the first conductive film are arranged side by side in the second direction, and the separate areas of the second conductive film are arranged side by side in the first direction. The method includes performing position detection based on a capacitive method by using the first conductive film and the second conductive film, and performing position detection based on a resistive method by generating a potential gradient in a predetermined direction in one of the second conductive film and the third conductive film and by using another one of the second conductive film and the third conductive film to detect a potential of a position of contact between the second conductive film and the third conductive film.

According to an embodiment, a touch panel includes a first conductive film having a plurality of separate areas, each of which has a strip shape with a length direction thereof extending in a first direction, and a second conductive film having a plurality of separate areas, each of which has a strip shape with a length direction thereof extending in a second direction substantially perpendicular to the first direction, wherein the separate areas of the first conductive film are arranged side by side in the second direction, and the separate areas of the second conductive film are arranged side by side in the first direction, wherein position detection based on a capacitive method is performed by using the first conductive film and the second conductive film, and wherein a potential of a position of contact between the first conductive film and the second conductive film is detected to detect the position of the contact.

According to an embodiment, a method of detecting position in a touch panel is provided. The touch panel includes a first conductive film having a plurality of separate areas, each of which has a strip shape with a length direction thereof extending in a first direction, and a second conductive film having a plurality of separate areas, each of which has a strip shape with a length direction thereof extending in a second direction substantially perpendicular to the first direction, wherein the separate areas of the first conductive film are arranged side by side in the second direction, and the separate areas of the second conductive film are arranged side by side in the first direction. The method includes performing position detection based on a capacitive method by using the first conductive film and the second conductive film, and performing position detection based on a resistive method by generating a potential gradient in a predetermined direction in one of the first conductive film and the second conductive film and by using another one of the first conductive film and the second conductive film to detect a potential of a position of contact between the first conductive film and the second conductive film.

According to at least one embodiment, a thin, low cost touch panel is provided that allows position to be detected only upon a slight touch and that does not require a touching object to be made of a particular material. Also, a method of detecting a position in such a touch panel is provided.

BRIEF DESCRIPTION OF THE DRAWINGS

Other objects and further features of the present invention will be apparent from the following detailed description when read in conjunction with the accompanying drawings, in which:

FIG. 13 is a drawing illustrating a touch panel of a first embodiment according to a second mode of the invention;

FIG. 28 is a block diagram of a control circuit of the touch panel;

DESCRIPTION OF EMBODIMENTS

In the following, embodiments will be described by referring to the accompanying drawings. The same or similar elements are referred to by the same or similar numerals.
[First Mode of Invention]
[First Embodiment]

Figure 1:
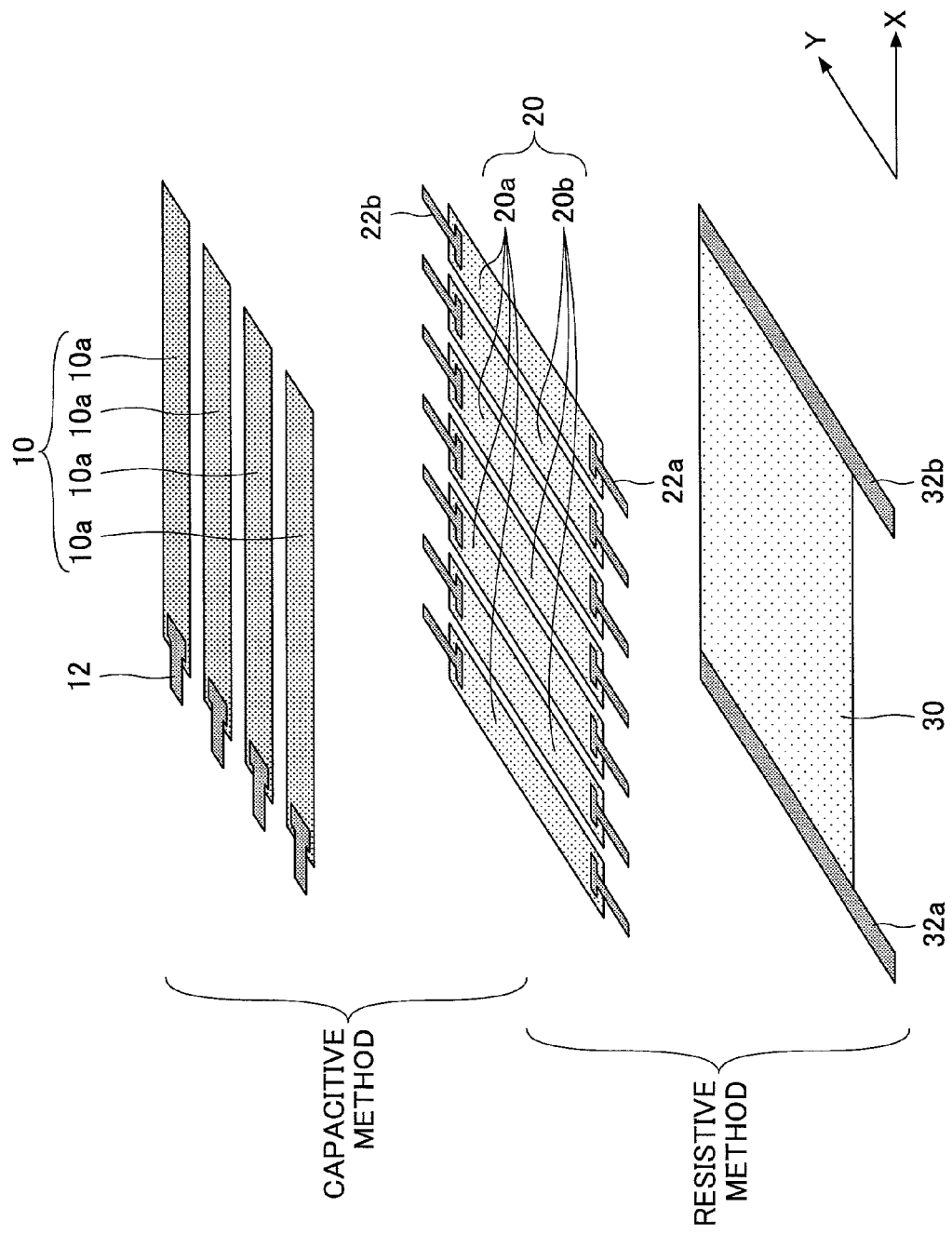
FIG. 1 is a drawing illustrating a touch panel of a first embodiment according to a first mode of the invention.
Figure 2:
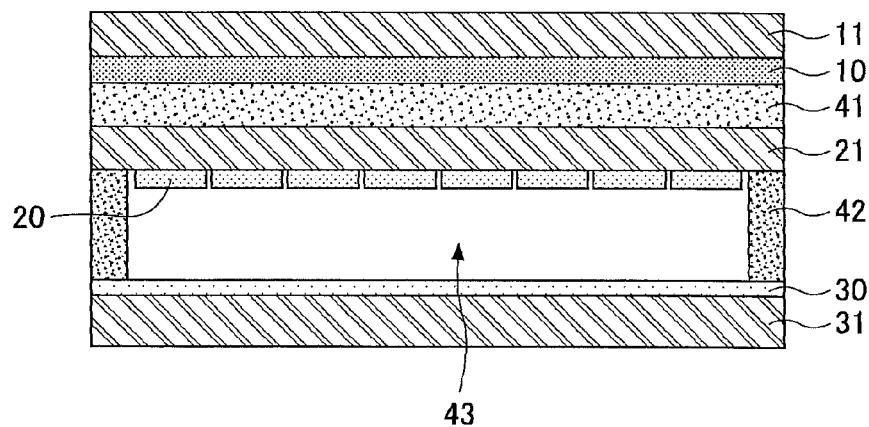
FIG. 2 is a drawing illustrating the structure of the touch panel of the first embodiment.

In the following, a description will be given of a touch panel according to a first embodiment. As illustrated in FIG. 1 and FIG. 2, the touch panel of the present embodiment includes a first transparent conductive film 10, a second transparent conductive film 20, and a third transparent conductive film 30. In the present embodiment, the position of a contact point (i.e., contact position) is detected by the capacitive method using the first transparent conductive film and the second transparent conductive film 20. The position of the contact point (i.e., contact position) is further detected by the resistive method using the second transparent conductive film 20 and the third transparent conductive film 30. In the present embodiment, the first transparent conductive film 10 serves as a first conductive film, and the second transparent conductive film 20 serves as a second conductive film, with the third transparent conductive film 30 serving as a third conductive film.

The first transparent conductive film 10 is formed on a surface of a first transparent substrate 11, and has a plurality of separate areas 10a each having a strip shape that has the length direction thereof extending in the X-axis direction. The separate areas 10a are arranged side by side in the Y-axis direction. One end of each of the separate areas 10a has an electrode 12 connected thereto. Although reference numerals are omitted from illustration, the electrode 12 is formed on each of the separate areas 10a.

The second transparent conductive film 20 is formed on a surface of a second transparent substrate 21, and has a plurality of separate areas 20a and 20b each having a strip shape that has the length direction thereof extending in the Y-axis direction. The separate areas 20a and 20b are alternately arranged side by side in the X-axis direction. The opposite ends of each of the separate areas 20a and 20b, i.e., the ends facing each other in the Y-axis direction, have electrodes 22a and 22b connected thereto, respectively. Although reference numerals are omitted from illustration, the electrodes 22a and 22b are formed on each of the separate areas 20a and 20b.

The third transparent conductive film 30 is formed substantially on the entire surface of a third transparent substrate 31, and has electrodes 32a and 32b connected thereto at the opposite ends in the X-axis direction.

The first transparent conductive film 10, the second transparent conductive film 20, and the third transparent conductive film 30 are made of electrically conductive transparent material that is metal oxide such as ITO (indium-tin oxide) or AZO (Al-doped zinc oxide). The first transparent conductive film 10, the second transparent conductive film 20, and the third transparent conductive film 30 may be made of a material other than metal oxide as long as they are made of conductive, transparent material. Namely, any material suffices as long as it is electrically conductive and transmits light. Specifically, conductive polymer, metal nanowire, carbon nanotube, and the like, which are referred to as a substitute for ITO or the like, may be used.

The first transparent substrate 11 and the second transparent substrate 21 are made of transparent resin material such as PET (polyethylene terephthalate), which is a material easy to bend. The third transparent substrate 31 is made of transparent inorganic material such as glass or transparent resin material such as plastics.

In the touch panel of the present embodiment, the surface of the first transparent substrate 11 that has the first transparent conductive film 10 disposed thereon is bonded through a transparent adhesive layer 41 to the surface of the second transparent substrate 21 opposite from the second transparent conductive film 20. The transparent adhesive layer 41 may be made of transparent adhesive agent such as epoxy resin. The second transparent substrate 21 is bonded through an adhesive member 42 such as a frame-shape double-faced tape to the third transparent substrate 31 such that the surface of the second transparent substrate 21 having the second transparent conductive film 20 disposed thereon faces the surface of the third transparent substrate 31 having the third transparent conductive film 30 disposed thereon. This arrangement creates a gap 43 between the second transparent substrate 21 and the third transparent substrate 31, so that the second transparent conductive film 20 and the third transparent conductive film 30 face each other across the gap 43.

<Drive Method>

In the following, a method of driving the touch panel according to the present embodiment will be described. In the touch panel of the present embodiment, position is detected by utilizing the capacitive method and the resistive method alternately in a time-division manner. Namely, position detection based on the resistive method is not performed when position detection based on the capacitive method is being performed. Position detection based on the capacitive method is not performed when position detection based on the resistive method is being performed.

A description will be given of position detection based on the capacitive method in the touch panel of the present embodiment with reference to FIG. 3. Position detection based on the capacitive method utilizes the first transparent conductive film 10 and the second transparent conductive film 20 to detect the position of a contact point. For the purpose of position detection based on the capacitive method, the separate areas of each of the first transparent conductive film 10 and the second transparent conductive film 20 are preferably spaced apart with gaps. In the present embodiment, the first transparent conductive film 10 is used only in the capacitive method, so that the separate areas 10a of the first transparent conductive film 10 have wide gaps therebetween.

The second transparent conductive film 20 is used both in the capacitive method and in the resistive method. The second transparent conductive film 20 has the separate areas 20a and 20b. In the case of position detection based on the capacitive method, only the separate areas 20a are used. Gaps between the separate areas 20a and the adjacent separate areas 20b of the second transparent conductive film 20 are narrow. These gaps are narrower than the gaps between the separate areas 10a of the first transparent conductive film 10. In the touch panel of the present embodiment, in the case of position detection based on the capacitive method, the separate areas 20a are driven through the electrodes 22a, but the separate areas 20b are not driven through the electrodes. The separate areas 20b are not even coupled to the ground, and stay in the open state, i.e., in the floating state.

In the touch panel of the present embodiment as described above, the first transparent conductive film 10 and the separate areas 20a of the second transparent conductive film 20 are used in the case of position detection based on the capacitive method.

A description will be given of position detection based on the resistive method in the touch panel of the present embodiment with reference to FIG. 4. Position detection based on the resistive method utilizes the second transparent conductive film 20 and the third transparent conductive film 30. Specifically, position detection is performed in the same or similar manner as the four-wire type of the resistive type. For the purpose of position detection based on the resistive method, the separate areas of the second transparent conductive film 20 preferably have narrow gaps therebetween. As in the case of the third transparent conductive film 30, a transparent conductive film would preferably be formed all over the surface without being divided into separate areas. Since the second transparent conductive film 20 is also used in the capacitive method, the second transparent conductive film 20 is divided into separate areas. In consideration of these, the separate areas 20a and 20b are formed with as small gaps as possible.

In the case of position detection based on the resistive method in the touch panel of the present embodiment, a predetermined voltage is applied between the electrodes 22a and the electrodes 22b to create a potential gradient in the second transparent conductive film 20. The third transparent conductive film 30 is then used to detect a potential at the point of contact with the second transparent conductive film 20, thereby detecting the coordinate of the contact point in the Y-axis direction. Further, a predetermined voltage is applied between the electrodes 32a and the electrodes 32b to create a potential gradient in the third transparent conductive film 30. The second transparent conductive film 20 is then used to detect a potential at the point of contact with the third transparent conductive film 30, thereby detecting the coordinate of the contact point in the X-axis direction. In this manner, the position of the contact point is detected based on the resistive method.

In the touch panel of the present embodiment as described above, the separate areas 20a and 20b of the second transparent conductive film 20 and the third transparent conductive film 30 are used in the case of position detection based on the resistive method.

[Second Embodiment]

Figure 5:
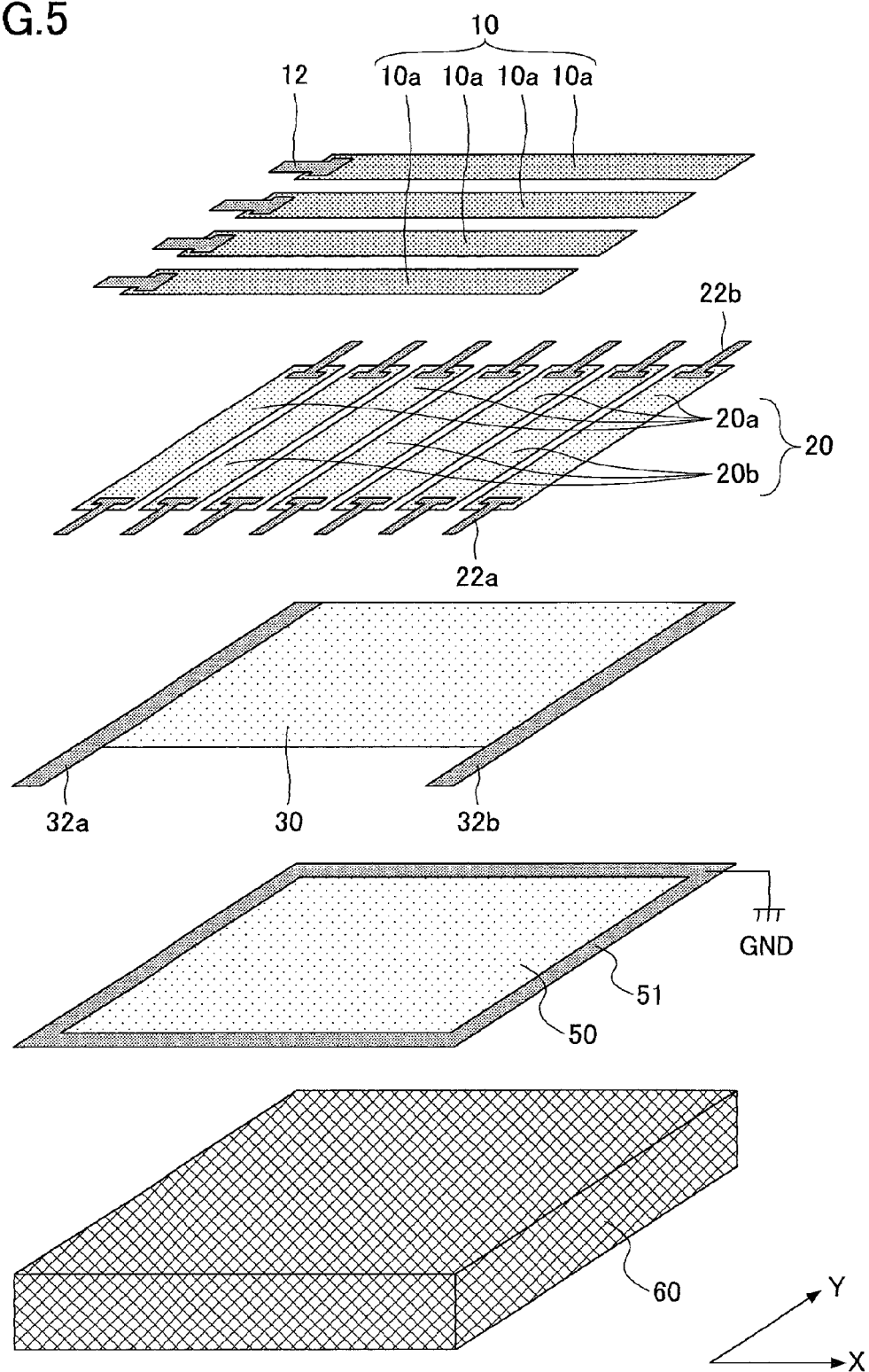
FIG. 5 is a drawing illustrating a touch panel of a second embodiment.
Figure 6:
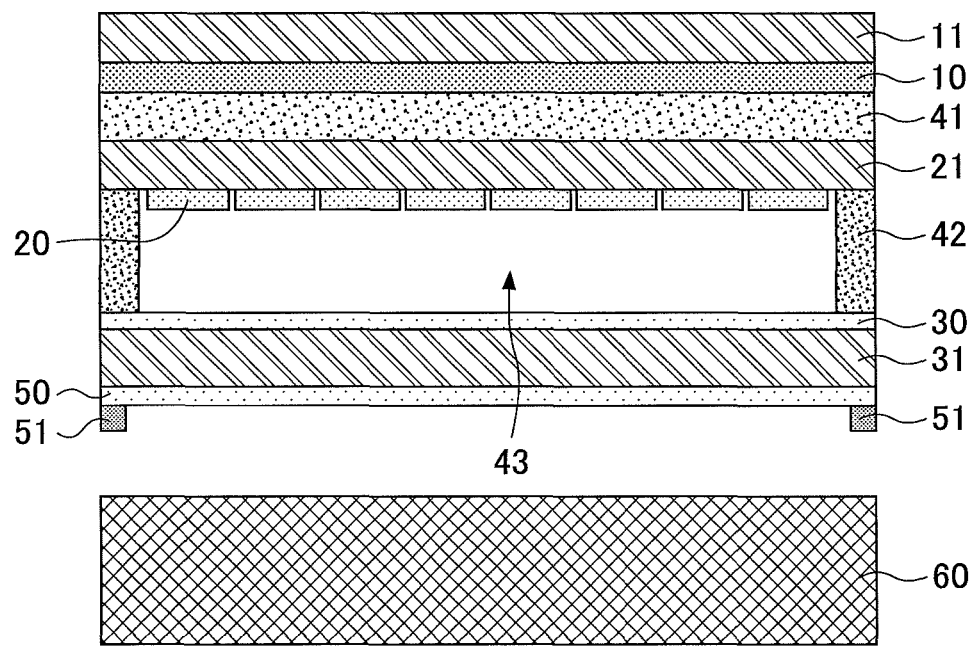
FIG. 6 is a drawing illustrating the structure of the touch panel of the second embodiment.

In the following, a second embodiment will be described. The present embodiment is directed to a touch panel in which a transparent conductive film is disposed for the purpose of preventing noise from a display apparatus such as a liquid crystal display apparatus. A description of this touch panel will be given with reference to FIG. 5 and FIG. 6. The touch panel of the present embodiment is mounted on a display apparatus 60 such as a liquid crystal display apparatus. The touch panel includes the first transparent conductive film 10, the second transparent conductive film 20, the third transparent conductive film 30, and a fourth transparent conductive film 50. The fourth transparent conductive film 50 is formed on the surface of the third transparent substrate 31 facing toward the display apparatus 60, i.e., the surface of the third transparent substrate 31 opposite from the third transparent conductive film 30. The fourth transparent conductive film 50 is coupled to the ground potential (GND) through an electrode 51 disposed along the perimeter of the fourth transparent conductive film 50. With this arrangement, the fourth transparent conductive film serves to block noises generated by the display apparatus 60, thereby preventing an erroneous detection when the position of a contact point is detected in the touch panel. The fourth transparent conductive film 50 is made of the same or similar material as that of the first transparent conductive film 10 or the like. The fourth transparent conductive film 50 of the present embodiment serves as a fourth conductive film.

[Third Embodiment]

Figure 7:
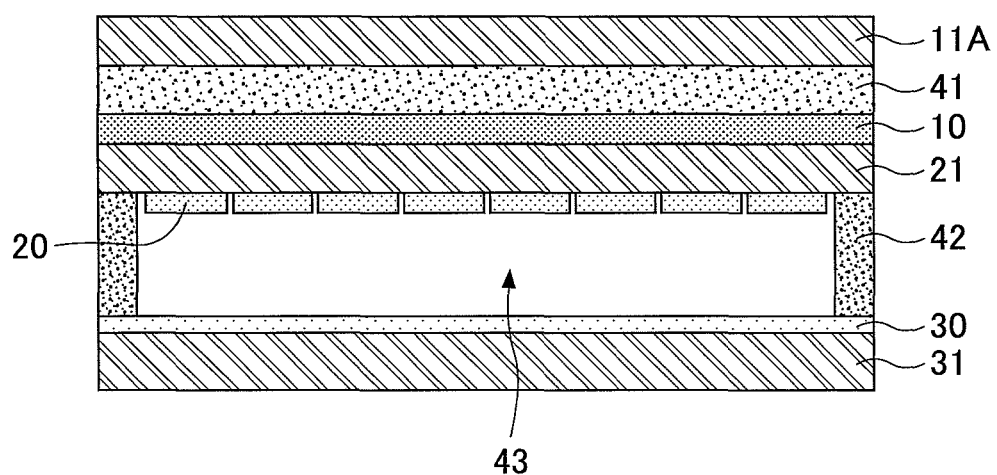
FIG. 7 is a drawing illustrating the structure of the touch panel of a third embodiment.

In the following, a third embodiment will be described. As illustrated in FIG. 7, the touch panel of the present embodiment has the second transparent conductive film 20 formed on one surface of the second transparent substrate 21, and has the first transparent conductive film 10 formed on the other surface of the second transparent substrate 21. With such a structure, a touch panel having a similar configuration to the touch panel of the first embodiment can be made without using the first transparent substrate 11, which contributes to thinning of the total thickness of the touch panel. It may be noted that in the present embodiment, as illustrated in FIG. 7, a thin transparent substrate 11A without a transparent conductive film formed thereon may be bounded through an adhesive layer 41 or the like.

[Fourth Embodiment]

Figure 8:
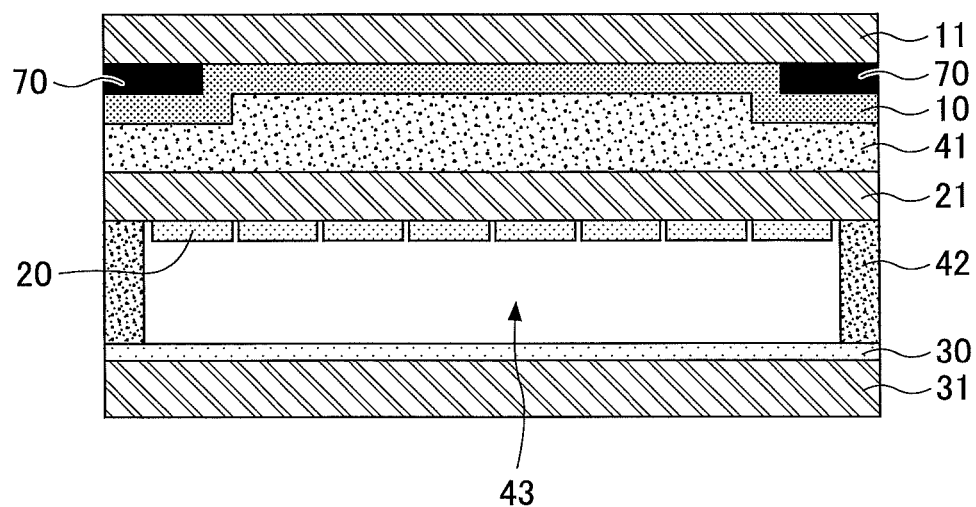
FIG. 8 is a drawing illustrating the structure of the touch panel of a fourth embodiment.

In the following, a fourth embodiment will be described. The present embodiment is directed to a touch panel having a decorative film that serves as a decorating part. Specifically, as illustrated in FIG. 8, the first transparent substrate 11 has, on the edge portions of one surface thereof, a decorative film 70 formed of black insulating material, which serve as a decorating part. The first transparent conductive film 10 is formed on the decorative film 70. The provision of the decorative film 70 on the edge portions of the touch panel for decorative purposes serves to increase the aesthetic appeal of the touch panel's appearance. The decorative film 70 may be formed by a screen printing method performed on one surface of the first transparent substrate 11, or may be made by bonding a film to one surface of the first transparent substrate 11. The first transparent conductive film 10 may be formed by bonding a transparent conductive film sheet on the surface on which the decorative film 70 is formed, or may be formed by a film growth method such as sputtering.

Figure 9A:
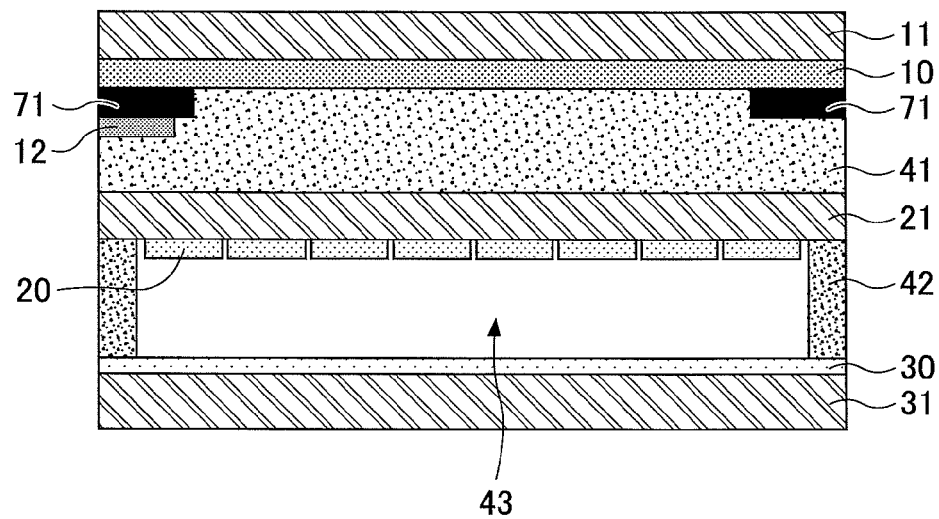
FIGS. 9A and 9B are drawings illustrating another touch panel of the fourth embodiment.
Figure 9B:
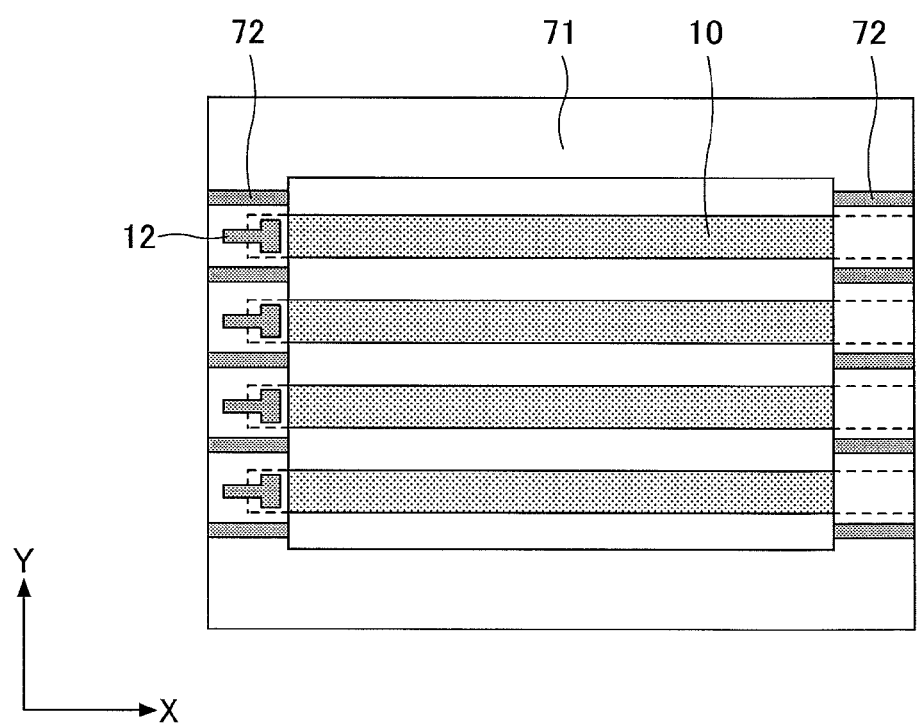

Alternatively, the touch panel of the present embodiment may have a decorative conductive film 71 formed on the first transparent conductive film 10 that is formed on the surface of the first transparent substrate 11 as illustrated in FIGS. 9A and 9B. In this case, the decorative film 71 may be made of black, conductive material. Such a film may be formed by a printing method such as a screen printing method utilizing black, conductive paste. The separate areas of the first transparent conductive film 10 are electrically isolated from each other. To this end, as illustrated in FIG. 9B, the decorative film 71 made of black, conductive material is partly removed at the gaps between the separate areas 10a of the first transparent conductive film 10. The areas where the decorative film 71 is removed have black, insulting portions 72 formed therein. Material of the black, conductive paste may be material including silver carbon or the like. Black insulating material may be material including pigment made of insulating black oxide or black resin material. FIG. 9A is a cross-sectional view of the touch panel, and FIG. 9B is a plan view of one surface of the first transparent conductive film 10.

Figure 10A:
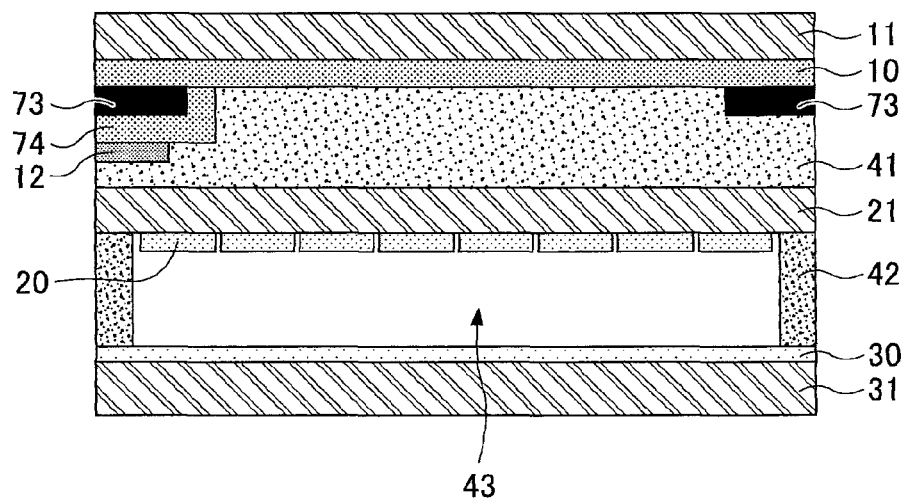
FIGS. 10A and 10B are drawings illustrating another touch panel of the fourth embodiment.
Figure 10B:
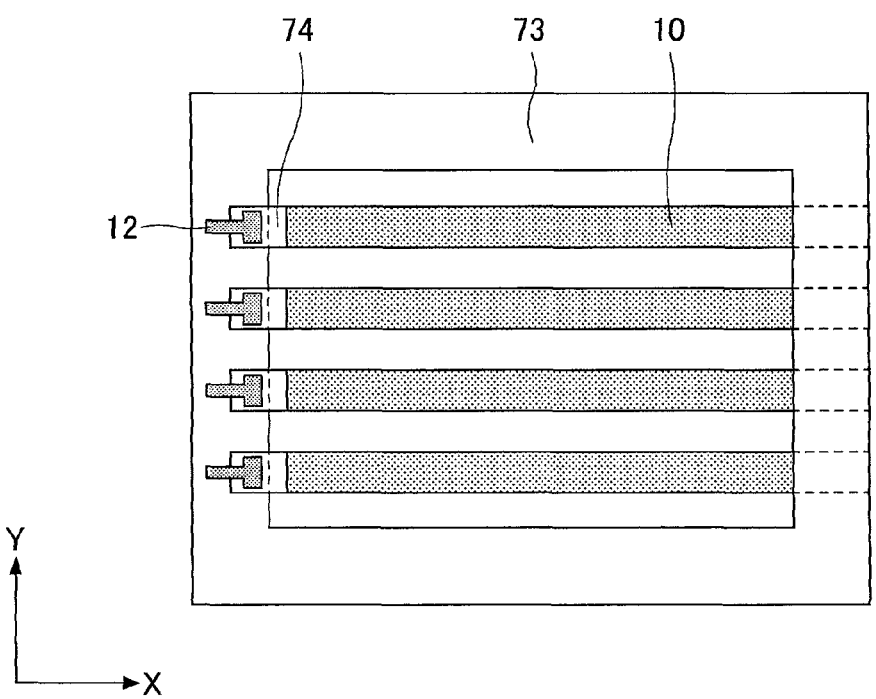

Alternatively, the touch panel of the present embodiment may have a decorative insulating film 73 formed on the first transparent conductive film 10 that is formed on the surface of the first transparent substrate 11 as illustrated in FIGS. 10A and 10B. In this case, the decorative film 73 may be formed by a printing method such as a screen printing method using black, insulating paste. Material of the black, insulating paste may be material including pigment made of insulating black oxide or black resin material. Further, a transparent conductive film 74 is formed to connect each of the separate areas of the first transparent conductive film 10 to a corresponding one of the electrodes 12. With this arrangement, the transparent conductive film 74 electrically connects each of the separate areas of the first transparent conductive film 10 to a corresponding one of the electrodes 12. The transparent conductive film 74 may be formed by a printing method such as a screen printing method using transparent conductive paste, which is made of transparent conductive material. Material of the transparent conductive paste may be one that includes fine particles of transparent conductive material such as ITO. FIG. 10A is a cross-sectional view of the touch panel, and FIG. 10B is a plan view of one surface of the first transparent conductive film 10.

[Fifth Embodiment]

In the following, a fifth embodiment will be described. The present embodiment is directed to a touch panel in which a reflection preventing film is formed in order to prevent reflection on a substrate, a transparent conductive film, or the like. The provision of the reflection preventing film serves to reduce reflection by the touch panel. Further, the separate areas of the first transparent conductive film 10 and the second transparent conductive film 20 become less conspicuous.

Figure 11:
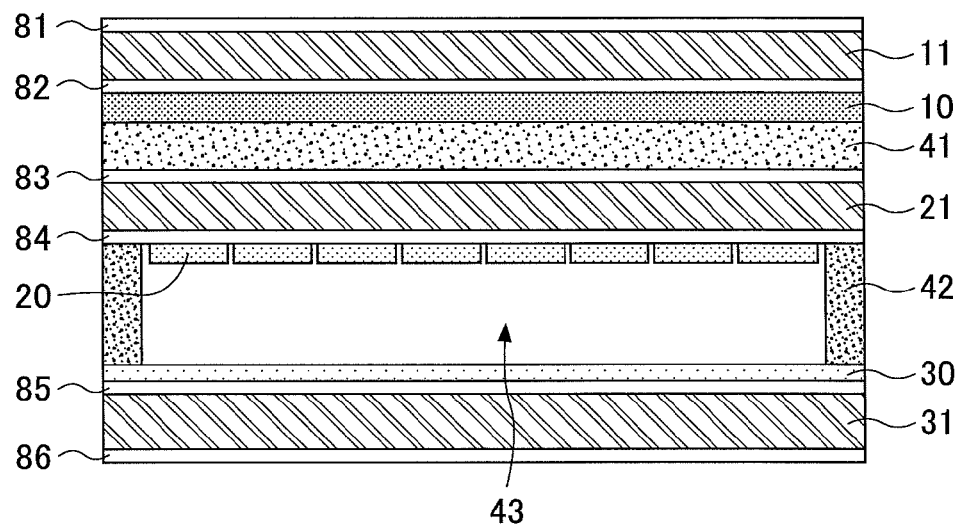
FIG. 11 is a drawing illustrating the structure of the touch panel of a fifth embodiment.

In the touch panel of the present embodiment illustrated in FIG. 11, the first transparent substrate 11 has a reflection preventing film 81 formed on the surface thereof opposite from the first transparent conductive film 10, and also has a reflection preventing film 82 on the surface thereof on the same side as the first transparent conductive film 10. Further, the second transparent substrate 21 has a reflection preventing film 83 formed on the surface thereof opposite from the second transparent conductive film 20, and also has a reflection preventing film 84 formed on the surface thereof on the same side as the second transparent conductive film 20. Moreover, the third transparent substrate 31 has a reflection preventing film 85 formed on the surface thereof on the same side as the third transparent conductive film 30, and also has a reflection preventing film 86 formed on the surface thereof opposite from the third transparent conductive film 30.

It may be noted that only some but not all of the reflection preventing films 81 through 86 may be formed in the touch panel of the present embodiment. Alternatively, all of these films may be formed. In the configuration illustrated in FIG. 11, the reflection preventing film 82 is formed between the first transparent substrate 11 and the first transparent conductive film 10, and the reflection preventing film 84 is formed between the second transparent substrate 21 and the second transparent conductive film 20, with the reflection preventing film 85 being formed between the third transparent substrate 31 and the third transparent conductive film 30. Alternatively, the reflection preventing film 82 may be formed on the first transparent conductive film 10 that is disposed on the first transparent substrate 11, and the reflection preventing film 84 may be formed on the second transparent conductive film 20 that is disposed on the second transparent substrate 21, with the reflection preventing film 85 being formed on the third transparent conductive film 30 that is disposed on the third transparent substrate 31. Each of the reflection preventing films 81 through 86 may be a multilayer dielectric film in which dielectric layers having respective, different refraction indexes are stacked one over another by a film growth method such as vacuum vapor deposition or sputtering. Alternatively, such reflection preventing films 81 through 86 may be formed by attaching a reflection preventing film such as an AR film. This arrangement serves to reduce reflection from the touch panel.

[Sixth Embodiment]

Figure 12:
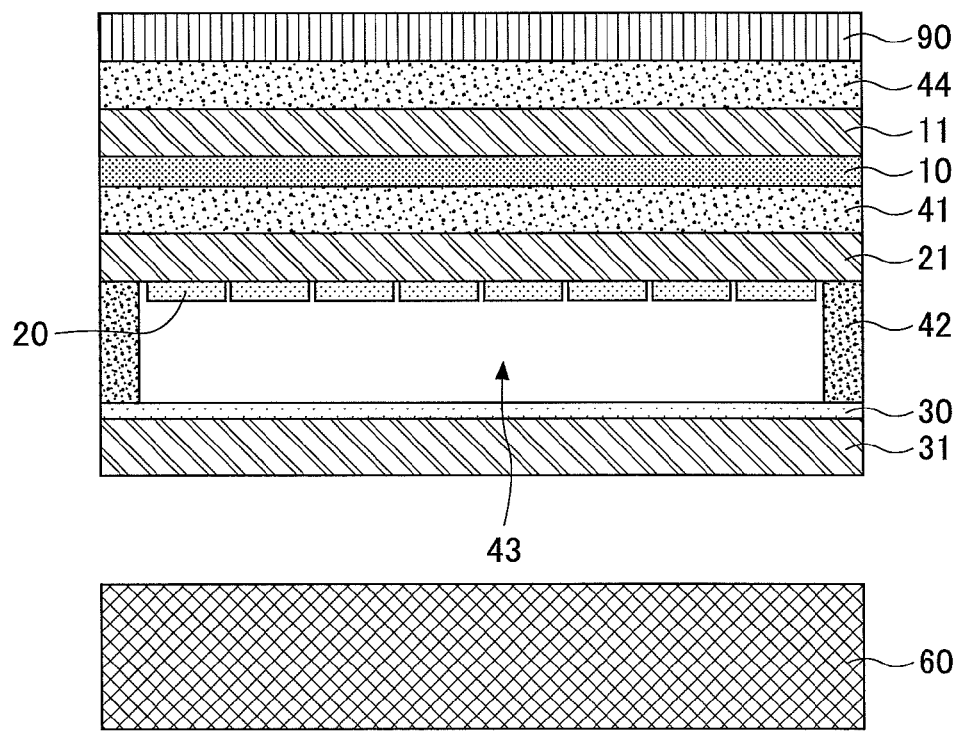
FIG. 12 is a drawing illustrating the structure of the touch panel of a sixth embodiment.

In the following, a sixth embodiment will be described. The present embodiment is directed to the touch panel in which a polarization plate is provided for the purpose of preventing reflection on the touch panel. The touch panel of the present embodiment is used when a liquid crystal display apparatus is used as the display apparatus 60. In this embodiment, a polarization plate 90 is disposed on the surface of the first transparent substrate 11 opposite from the first transparent conductive film as illustrated in FIG. 12. The touch panel illustrated in FIG. 12 is mounted on the display screen of the display apparatus 60. The display apparatus 60 is situated on the opposite side of the third transparent substrate 31 from the third transparent conductive film 30. The polarization plate 90 is attached via an adhesive layer 44 to the surface of the first transparent substrate 11 opposite from the first transparent conductive film 10. The polarization plate 90 is securely placed after the position thereof is adjusted relative to the polarization direction of the polarization plate used in the display apparatus 60. This arrangement serves to reduce reflection from the touch panel.

The touch panel of the present embodiment is used when a liquid crystal display apparatus is used as the display apparatus 60. Because of the use of the polarization plate 90, the first transparent substrate 11, the second transparent substrate 21, and the third transparent substrate 31 are preferably made of material having optical isotropy without birefringence or the like. Specifically, the first transparent substrate 11, the second transparent substrate 21, and the third transparent substrate 31 may preferably be made of resin material having optical isotropy such as polycarbonate or inorganic material having optical isotropy such as glass.

[Second Mode of Invention]

In the following, a second mode of the invention will be described. Embodiments of the second mode of the invention will not be specifically referred to as those of the second mode of invention. When referring to an embodiment of another mode of the invention different from the second mode, an indication to that effect will be expressly provided.

[First Embodiment]

Figure 14:
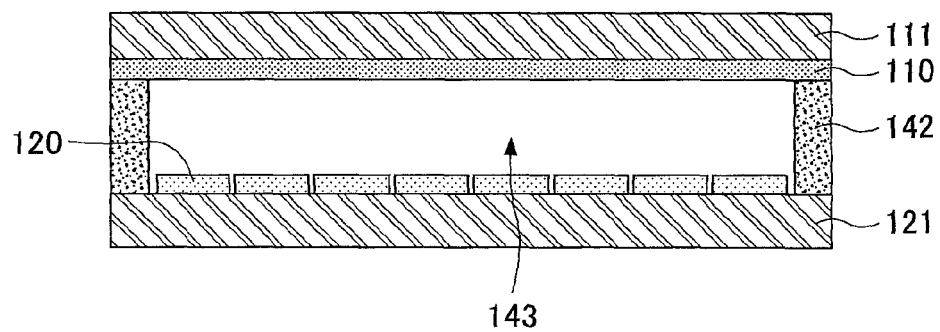
FIG. 14 is a drawing illustrating the structure of the touch panel of the first embodiment.

In the following, a description will be given of a touch panel according to a first embodiment. As illustrated in FIG. 13 and FIG. 14, the touch panel of the present embodiment includes a first transparent conductive film 110 and a second transparent conductive film 20. In the present embodiment, the position of a contact point (i.e., contact position) is detected by the capacitive method using the first transparent conductive film 110 and the second transparent conductive film 120, which are also used to detect the position of the contact point (i.e. contact position) by use of the resistive method. In the present embodiment, the first transparent conductive film 110 serves as a first conductive film, and the second transparent conductive film 120 serves as a second conductive film.

The first transparent conductive film 110 is formed on a surface of a first transparent substrate 111, and has a plurality of separate areas 110a and 110b each having a strip shape that has the length direction thereof extending in the X-axis direction. The separate areas 110a and 110b are alternately arranged side by side in the Y-axis direction. The opposite ends of each of the separate areas 110a and 110b, i.e., the ends facing each other in the X-axis direction, have electrodes 112a and 112b connected thereto, respectively. Although reference numerals are omitted from illustration, the electrodes 112a and 112b are formed on each of the separate areas 110a and 110b.

The second transparent conductive film 120 is formed on a surface of a second transparent substrate 121, and has a plurality of separate areas 120a and 120b each having a strip shape that has the length direction thereof extending in the Y-axis direction. The separate areas 120a and 120b are alternately arranged side by side in the X-axis direction. The opposite ends of each of the separate areas 120a and 120b, i.e., the ends facing each other in the Y-axis direction, have electrodes 122a and 122b connected thereto, respectively. Although reference numerals are omitted from illustration, the electrodes 122a and 122b are formed on each of the separate areas 120a and 120b.

The first transparent conductive film 110 and the second transparent conductive film 120 are made of electrically conductive transparent material that is metal oxide such as ITO (indium-tin oxide) or AZO (Al-doped zinc oxide). The first transparent conductive film 110 and the second transparent conductive film 120 may be made of a material other than metal oxide as long as they are made of conductive, transparent material. Namely, any material suffices as long as it is electrically conductive and transmits light. Specifically, conductive polymer, metal nanowire, carbon nanotube, and the like, which are referred to as a substitute for ITO or the like, may be used.

The first transparent substrate 111 is made of transparent resin material such as PET (polyethylene terephthalate), which is a material easy to bend. The second transparent substrate 121 is made of transparent inorganic material such as glass or transparent resin material such as plastics.

In the touch panel of the present embodiment, the first transparent substrate 111 is bonded through an adhesive member 142 such as a frame-shape double-faced tape to the second transparent substrate 121 such that the surface of the first transparent substrate 111 having the first transparent conductive film 110 disposed thereon faces the surface of the second transparent substrate 121 having the second transparent conductive film 120 disposed thereon. This arrangement creates a gap 143 between the first transparent substrate 111 and the second transparent substrate 121, so that the first transparent conductive film 110 and the second transparent conductive film 120 face each other across the gap 143.

<Drive Method>

In the following, a method of driving the touch panel according to the present embodiment will be described. In the touch panel of the present embodiment, position is detected by utilizing the capacitive method and the resistive method alternately in a time-division manner. Namely, position detection based on the resistive method is not performed when position detection based on the capacitive method is being performed. Position detection based on the capacitive method is not performed when position detection based on the resistive method is being performed.

A description will be given of position detection based on the capacitive method in the touch panel of the present embodiment with reference to FIG. 15. Position detection based on the capacitive method utilizes the first transparent conductive film 110 and the second transparent conductive film 120 to detect the position of a contact point. For the purpose of position detection based on the capacitive method, the separate areas of each of the first transparent conductive film 110 and the second transparent conductive film 120 are preferably spaced apart with gaps. In the present embodiment, the first transparent conductive film 110 and the second transparent conductive film 120 are used in the resistive method as well as in the capacitive method. As was previously described, the first transparent conductive film 110 has the separate areas 110a and 110b, and the second transparent conductive film 120 has the separate areas 120a and 120b. In the case of position detection based on the capacitive method, only the separate areas 110a among the separate areas 110a and 110b are used, and only the separate areas 120a among the separate areas 120a and 120b are used. Namely, in the case of position detection based on the capacitive method in the touch panel of the present embodiment, the separate areas 110a are driven through the electrodes 112a, but the separate areas 110b are not driven through the electrodes. The separate areas 110b are not even coupled to the ground, and stay in the open state, i.e., in the floating state. Similarly, the separate areas 120a are driven by the electrodes 122b but the separate areas 120b are not driven by the electrodes 122b. The separate areas 120b are not even coupled to the ground, and stay in the open state, i.e., in the floating state.

In the touch panel of the present embodiment as described above, the separate areas 110a of the first transparent conductive film 110 and the separate areas 120a of the second transparent conductive film 120 are used in the case of position detection based on the capacitive method.

A description will be given of position detection based on the resistive method in the touch panel of the present embodiment with reference to FIG. 16. Position detection based on the resistive method utilizes the first transparent conductive film 110 and the second transparent conductive film 120. Specifically, position detection is performed in the same or similar manner as the four-wire type of the resistive type. For the purpose of position detection based on the resistive method, the separate areas of the first transparent conductive film 110 and the second transparent conductive film 120 preferably have narrow gaps therebetween. As a matter of fact, a transparent conductive film would preferably be formed all over the surface without being divided into separate areas. Since the first transparent conductive film 110 and the second transparent conductive film 120 are also used in the capacitive method, these films are divided into separate areas. In consideration of this, gaps between the separate areas 110a and the adjacent separate areas 110b as well as gaps between the separate areas 120a and the adjacent separate areas 120b are formed to be as narrow as possible.

In the case of position detection based on the resistive method in the touch panel of the present embodiment, a predetermined voltage is applied between the electrodes 112a and the electrodes 112b to create a potential gradient in the first transparent conductive film 110. The second transparent conductive film 120 is then used to detect a potential at the point of contact with the first transparent conductive film 110, thereby detecting the coordinate of the contact point in the X-axis direction. Further, a predetermined voltage is applied between the electrodes 122a and the electrodes 122b to create a potential gradient in the second transparent conductive film 120. The first transparent conductive film 110 is then used to detect a potential at the point of contact with the second transparent conductive film 120, thereby detecting the coordinate of the contact point in the Y-axis direction. In this manner, the position of the contact point is detected based on the resistive method.

In the touch panel of the present embodiment as described above, the separate areas 110a and 110b of the first transparent conductive film 110 and the separate areas 120a and 120b of the second transparent conductive film 120 are used in the case of position detection based on the resistive method.

[Second Embodiment]

Figure 17:
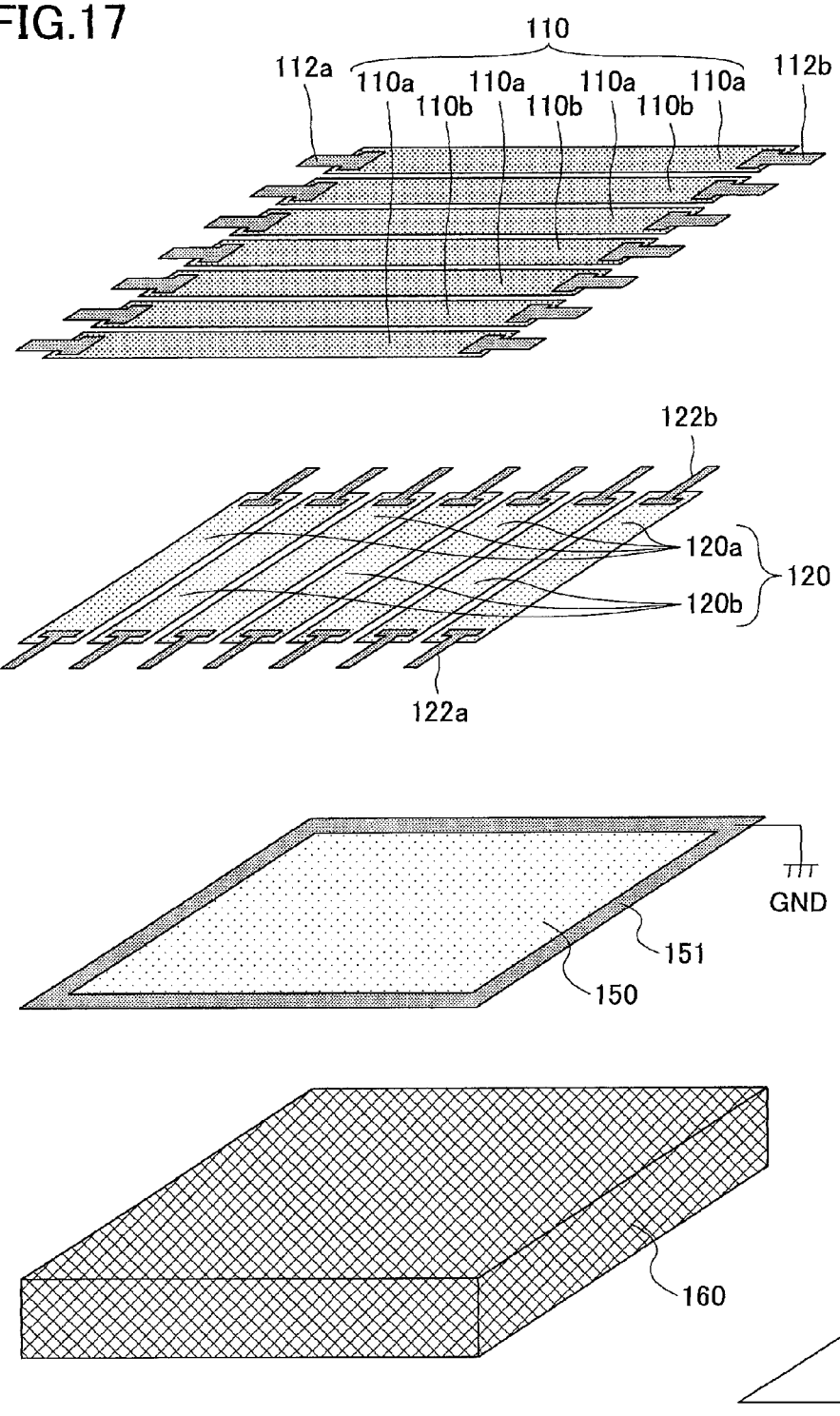
FIG. 17 is a drawing illustrating a touch panel of a second embodiment.
Figure 18:
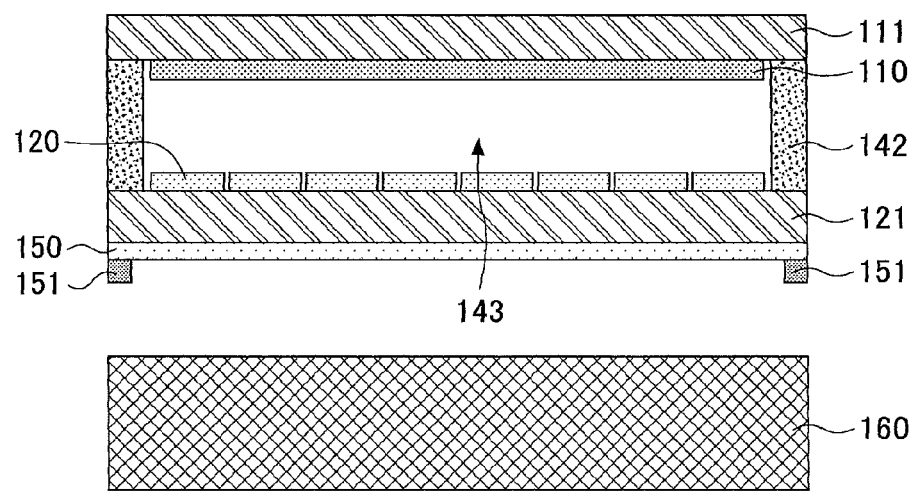
FIG. 18 is a drawing illustrating the structure of the touch panel of the second embodiment.

In the following, a second embodiment will be described. The present embodiment is directed to a touch panel in which a transparent conductive film is disposed for the purpose of preventing noise from a display apparatus such as a liquid crystal display apparatus. A description of this touch panel will be given with reference to FIG. 17 and FIG. 18. The touch panel of the present embodiment is mounted on a display apparatus 160 such as a liquid crystal display apparatus. The touch panel includes the first transparent conductive film 110, the second transparent conductive film 120, and a third transparent conductive film 150. The third transparent conductive film 150 is formed on the surface of the second transparent substrate 121 facing toward the display apparatus 160, i.e., the surface of the second transparent substrate 121 opposite from the second transparent conductive film 120. The third transparent conductive film 150 is coupled to the ground potential (GND) through an electrode 151 disposed along the perimeter of the third transparent conductive film 150. With this arrangement, the third transparent conductive film 150 serves to block noises generated by the display apparatus 160, thereby preventing an erroneous detection when the position of a contact point is detected in the touch panel. The third transparent conductive film 150 is made of the same or similar material as that of the first transparent conductive film 110 or the like. The third transparent conductive film 150 of the present embodiment serves as a third conductive film.

[Third Embodiment]

Figure 19:
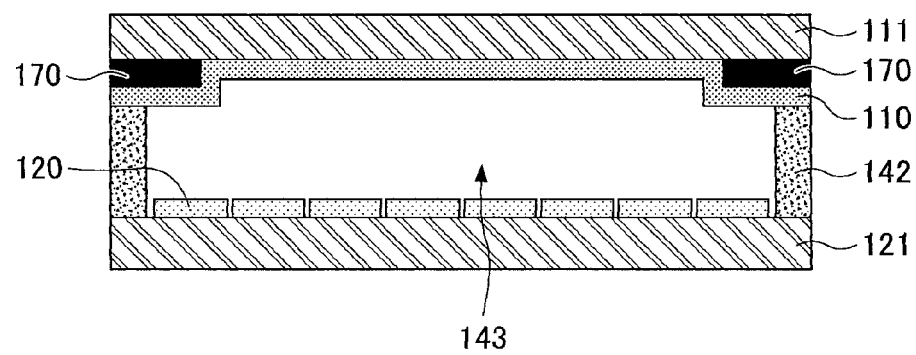
FIG. 19 is a drawing illustrating the structure of the touch panel of a third embodiment.

In the following, a third embodiment will be described. The present embodiment is directed to a touch panel having a decorative film that serves as a decorating part. Specifically, as illustrated in FIG. 19, the first transparent substrate 111 has, on the edge portions of one surface thereof, a decorative film 170 formed of black insulating material, which serves as a decorating part. The first transparent conductive film 110 is formed on the decorative film 170. The provision of the decorative film 170 on the edge portions of the touch panel for decorative purposes serves to increase the aesthetic appeal of the touch panel's appearance. The decorative film 170 may be formed by a screen printing method performed on one surface of the first transparent substrate 111, or may be made by bonding a film to one surface of the first transparent substrate 111. The first transparent conductive film 110 may be formed by bonding a transparent conductive film sheet on the surface on which the decorative film 170 is formed, or may be formed by a film growth method such as sputtering.

Figure 20A:
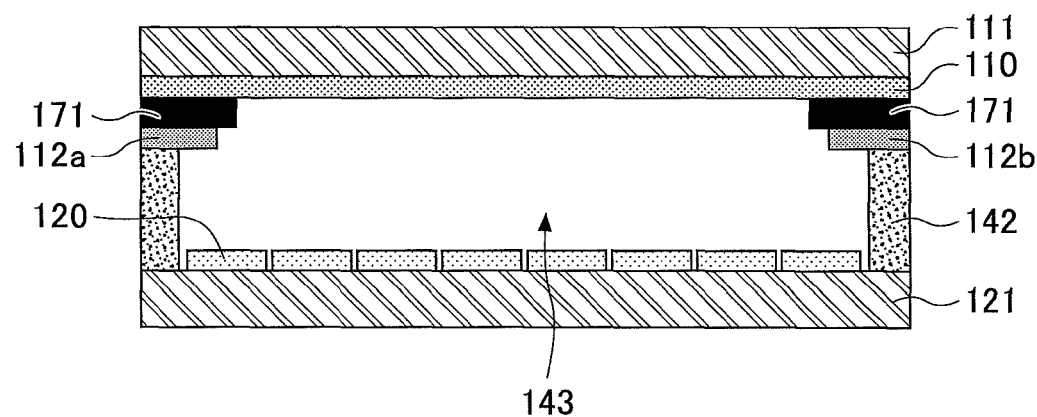
FIGS. 20A and 20B are drawings illustrating another touch panel of the third embodiment.
Figure 20B:
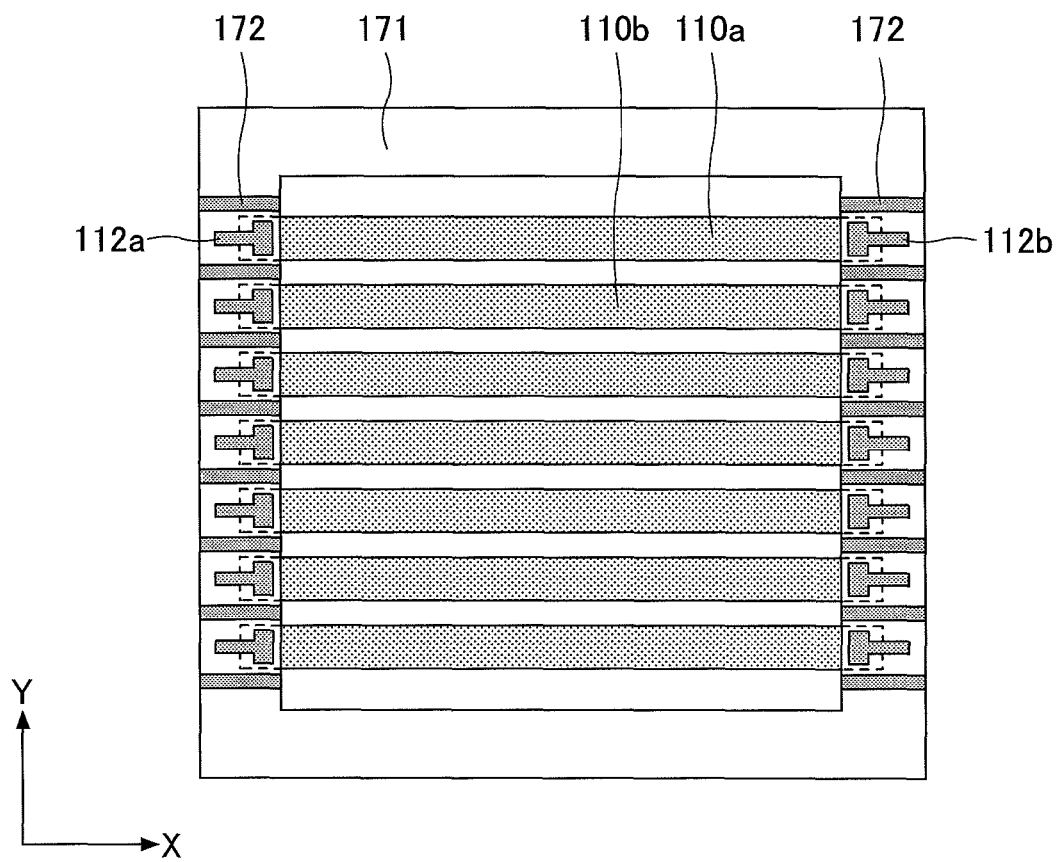

Alternatively, the touch panel of the present embodiment may have a decorative conductive film 171 formed on the first transparent conductive film 110 that is formed on the surface of the first transparent substrate 111 as illustrated in FIGS. 20A and 20B. In this case, the decorative film 171 may be made of black, conductive material. Such a film may be formed by a printing method such as a screen printing method utilizing black, conductive paste. The separate areas of the first transparent conductive film 110 are electrically isolated from each other. To this end, as illustrated in FIG. 20B, the decorative film 171 made of black, conductive material is partly removed at the gaps between the separate areas 110a and 110b of the first transparent conductive film 110. The areas where the decorative film 171 is removed have black, insulting portions 172 formed therein. Material of the black, conductive paste may be material including silver carbon or the like. Black insulating material may be material including pigment made of insulating black oxide or black resin material. FIG. 20A is a cross-sectional view of the touch panel, and FIG. 20B is a plan view of one surface of the first transparent conductive film 110.

Figure 21A:
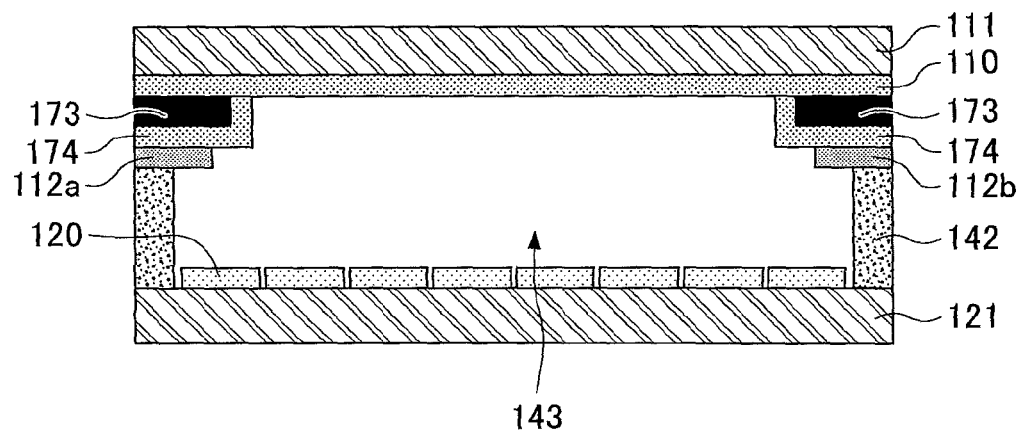
FIGS. 21A and 21B are drawings illustrating another touch panel of the third embodiment.
Figure 21B:
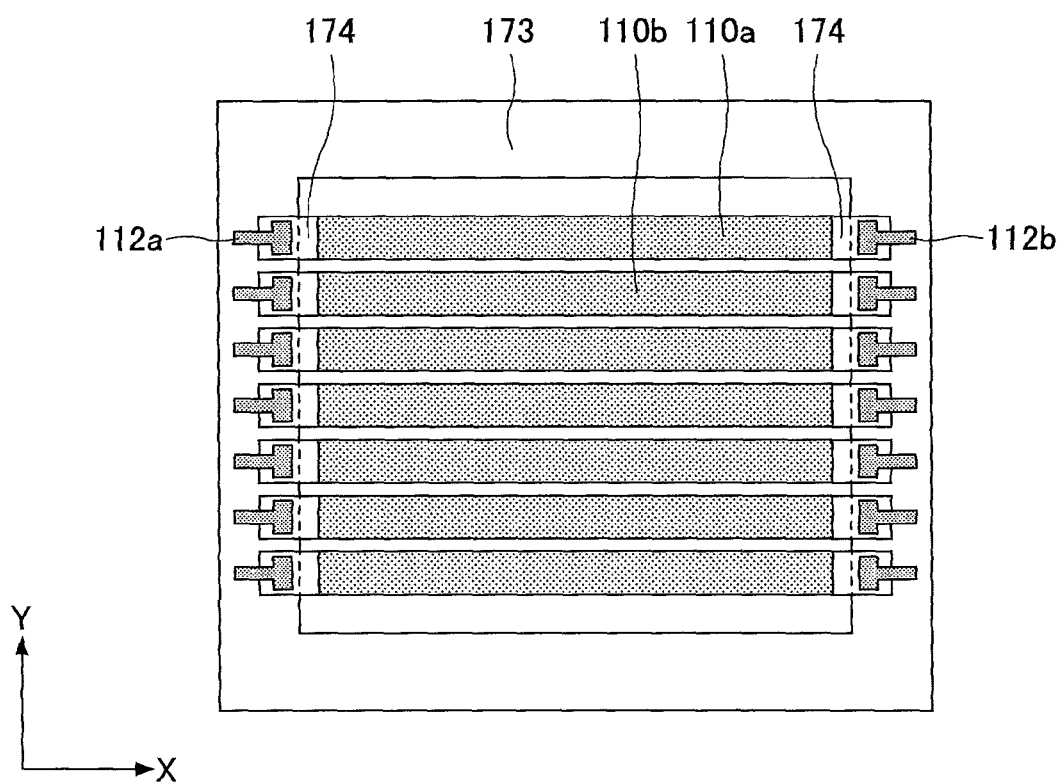

Alternatively, the touch panel of the present embodiment may have a decorative insulating film 173 formed on the first transparent conductive film 110 that is formed on the surface of the first transparent substrate 111 as illustrated in FIGS. 21A and 21B. In this case, the decorative film 173 may be formed by a printing method such as a screen printing method using black, insulating paste. Material of the black, insulating paste may be material including pigment made of insulating black oxide or black resin material. Further, a transparent conductive film 174 is formed to connect each of the separate areas 110a and 110b of the first transparent conductive film 110 to a corresponding pair of the electrodes 112a and 112b. With this arrangement, the transparent conductive film 174 serves to electrically connect each of the separate areas 110a and 110b of the first transparent conductive film 110 to a corresponding pair of the electrodes 112a and 112b. The transparent conductive film 174 may be formed by a printing method such as a screen printing method using transparent conductive paste, which is made of transparent conductive material. Material of the transparent conductive paste may be one that includes fine particles of transparent conductive material such as ITO. FIG. 21A is a cross-sectional view of the touch panel, and FIG. 21B is a plan view of one surface of the first transparent conductive film 110.

[Fourth Embodiment]

In the following, a fourth embodiment will be described. The present embodiment is directed to a touch panel in which a reflection preventing film is formed in order to prevent reflection on a substrate, a transparent conductive film, or the like. The provision of the reflection preventing film serves to reduce reflection by the touch panel. Further, the separate areas of the first transparent conductive film 110 and the second transparent conductive film 120 become less conspicuous.

Figure 22:
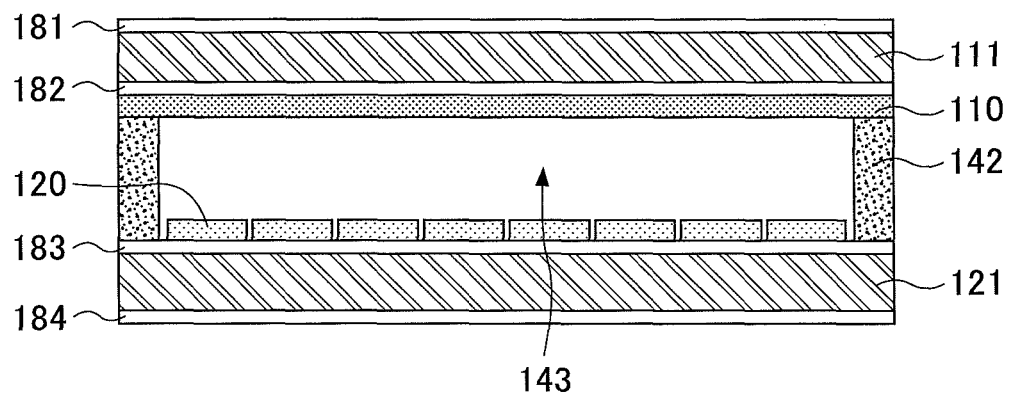
FIG. 22 is a drawing illustrating the structure of the touch panel of a fourth embodiment.

In the touch panel of the present embodiment illustrated in FIG. 22, the first transparent substrate 111 has a reflection preventing film 181 formed on the surface thereof opposite from the first transparent conductive film 110, and also has a reflection preventing film 182 formed on the surface thereof on the same side as the first transparent conductive film 110. Further, the second transparent substrate 121 has a reflection preventing film 183 formed on the surface thereof on the same side as the second transparent conductive film 120, and also has a reflection preventing film 184 formed on the surface thereof opposite from the second transparent conductive film 120. It may be noted that only some but not all of the reflection preventing films 181 through 184 may be formed in the touch panel of the present embodiment. Alternatively, all of these films may be formed. In the configuration illustrated in FIG. 22, the reflection preventing film 182 is formed between the first transparent substrate 111 and the first transparent conductive film 110, and the reflection preventing film 183 is formed between the second transparent substrate 121 and the second transparent conductive film 120. Alternatively, the reflection preventing film 182 may be formed on the first transparent conductive film 110 that is disposed on the first transparent substrate 111, and the reflection preventing film 183 may be formed on the second transparent conductive film 120 that is disposed on the second transparent substrate 121. Each of the reflection preventing films 181 through 184 may be a multilayer dielectric film in which dielectric layers having respective, different refraction indexes are stacked one over another by a film growth method such as vacuum vapor deposition or sputtering. Alternatively, such reflection preventing films 181 through 184 may be formed by attaching a reflection preventing film such as an AR film. This arrangement serves to reduce reflection from the touch panel.

[Fifth Embodiment]

Figure 23:
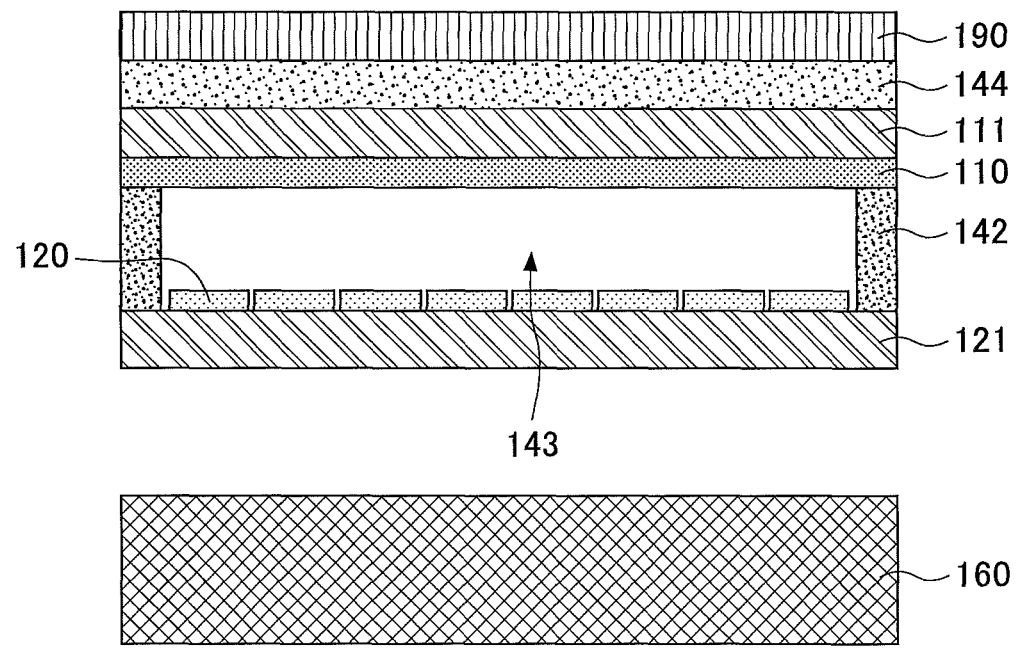
FIG. 23 is a drawing illustrating the structure of the touch panel of a fifth embodiment.

In the following, a fifth embodiment will be described. The present embodiment is directed to the touch panel in which a polarization plate is provided for the purpose of preventing reflection on the touch panel. The touch panel of the present embodiment is used when a liquid crystal display apparatus is used as the display apparatus 160. In this embodiment, a polarization plate 190 is disposed on the surface of the first transparent substrate 111 opposite from the first transparent conductive film 110 as illustrated in FIG. 23. The touch panel illustrated in FIG. 23 is mounted on the display screen of the display apparatus 160. The display apparatus 160 is situated on the opposite side of the second transparent substrate 121 from the second transparent conductive film 120. The polarization plate 190 is attached via an adhesive layer 144 to the surface of the first transparent substrate 111 opposite from the first transparent conductive film 110. The polarization plate 190 is securely placed after the position thereof is adjusted relative to the polarization direction of the polarization plate used in the display apparatus 160. This arrangement serves to reduce reflection from the touch panel.

The touch panel of the present embodiment is used when a liquid crystal display apparatus is used as the display apparatus 160. Because of the use of the polarization plate 190, the first transparent substrate 111 and the second transparent substrate 121 are preferably made of material having optical isotropy without birefringence or the like. Specifically, the first transparent substrate 111 and the second transparent substrate 121 may preferably be made of resin material having optical isotropy such as polycarbonate or inorganic material having optical isotropy such as glass.

[Third Mode of Invention]

In the following, a third mode of the invention will be described. Embodiments of the third mode of the invention will not be specifically referred to as those of the third mode of invention unless it is necessary. When referring to an embodiment of another mode of the invention different from the third mode, an indication to that effect will be expressly provided.

[First Embodiment]

The first embodiment of the third mode of the invention will be described with reference to FIG. 1 through FIG. 4 illustrating the first embodiment of the first mode of the invention.

In the following, a description will be given of a touch panel according to a first embodiment. As illustrated in FIG. 1 and FIG. 2, the touch panel of the present embodiment includes a first transparent conductive film 10, a second transparent conductive film 20, and a third transparent conductive film 30. In the present embodiment, the position of a contact point (i.e., contact position) is detected by the capacitive method using the first transparent conductive film 10 and the second transparent conductive film 20. Further, the position of the contact point (i.e., contact position) is detected by the resistive method using the second transparent conductive film 20 and the third transparent conductive film 30. In the present embodiment, the first transparent conductive film 10 serves as a first conductive film, and the second transparent conductive film 20 serves as a second conductive film, with the third transparent conductive film 30 serving as a third conductive film.

The first transparent conductive film 10 is formed on a surface of a first transparent substrate 11, and has a plurality of separate areas 10a each having a strip shape that has the length direction thereof extending in the X-axis direction. The separate areas 10a are arranged side by side in the Y-axis direction. One end of each of the separate areas 10a has an electrode 12 connected thereto. Although reference numerals are omitted from illustration, the electrode 12 is formed on each of the separate areas 10a.

The second transparent conductive film 20 is formed on a surface of a second transparent substrate 21, and has a plurality of separate areas 20a and 20b each having a strip shape that has the length direction thereof extending in the Y-axis direction. The separate areas 20a and 20b are alternately arranged side by side in the X-axis direction. The opposite ends of each of the separate areas 20a and 20b, i.e., the ends facing each other in the Y-axis direction, have electrodes 22a and 22b connected thereto, respectively. Although reference numerals are omitted from illustration, the electrodes 22a and 22b are formed on each of the separate areas 20a and 20b.

The third transparent conductive film 30 is formed substantially on the entire surface of a third transparent substrate 31, and has electrodes 32a and 32b connected thereto at the opposite ends in the X-axis direction.

The first transparent conductive film 10, the second transparent conductive film 20, and the third transparent conductive film 30 are made of electrically conductive transparent material that is metal oxide such as ITO (indium-tin oxide) or AZO (Al-doped zinc oxide). The first transparent conductive film 10, the second transparent conductive film 20, and the third transparent conductive film 30 may be made of a material other than metal oxide as long as they are made of conductive, transparent material. Namely, any material suffices as long as it is electrically conductive and transmits light. Specifically, conductive polymer, metal nanowire, carbon nanotube, and the like, which are referred to as a substitute for ITO or the like, may be used.

The first transparent substrate 11 and the second transparent substrate 21 are made of transparent resin material such as PET (polyethylene terephthalate), which is a material easy to bend. The third transparent substrate 31 is made of transparent inorganic material such as glass or transparent resin material such as plastics.

In the touch panel of the present embodiment, the surface of the first transparent substrate 11 that has the first transparent conductive film 10 disposed thereon is bonded through a transparent adhesive layer 41 to the surface of the second transparent substrate 21 opposite from the second transparent conductive film 20. The transparent adhesive layer 41 may be made of transparent adhesive agent such as epoxy resin. The second transparent substrate 21 is bonded through an adhesive member 42 such as a frame-shape double-faced tape to the third transparent substrate 31 such that the surface of the second transparent substrate 21 having the second transparent conductive film 20 disposed thereon faces the surface of the third transparent substrate 31 having the third transparent conductive film 30 disposed thereon. This arrangement creates a gap 43 between the second transparent substrate 21 and the third transparent substrate 31, so that the second transparent conductive film 20 and the third transparent conductive film 30 face each other across the gap 43.

<Drive Method>

In the following, a method of driving the touch panel according to the present embodiment will be described. In the touch panel of the present embodiment, position is detected by utilizing the capacitive method and the resistive method alternately in a time-division manner. Namely, position detection based on the resistive method is not performed when position detection based on the capacitive method is being performed. Position detection based on the capacitive method is not performed when position detection based on the resistive method is being performed. Position detection based on the capacitive method and position detection based on the resistive method are performed alternately.

A description will be given of position detection based on the capacitive method in the touch panel of the present embodiment with reference to FIG. 3. Position detection based on the capacitive method utilizes the first transparent conductive film 10 and the second transparent conductive film 20 to detect the position of a contact point. For the purpose of position detection based on the capacitive method, the separate areas of each of the first transparent conductive film 10 and the second transparent conductive film 20 are preferably spaced apart with gaps. In the present embodiment, the first transparent conductive film 10 is used only in the capacitive method, so that the separate areas 10a of the first transparent conductive film 10 have wide gaps therebetween.

The second transparent conductive film 20 is used both in the capacitive method and in the resistive method. The second transparent conductive film 20 has the separate areas 20a and 20b. In the case of position detection based on the capacitive method, only the separate areas 20a are used. Gaps between the separate areas 20a and the adjacent separate areas 20b of the second transparent conductive film 20 are narrow. These gaps are narrower than the gaps between the separate areas 10a of the first transparent conductive film 10. In the touch panel of the present embodiment, in the case of position detection based on the capacitive method, the separate areas 20a are driven through the electrodes 22a, but the separate areas 20b are not driven through the electrodes. The separate areas 20b are not even coupled to the ground, and stay in the open state, i.e., in the floating state.

In the touch panel of the present embodiment as described above, the first transparent conductive film 10 and the separate areas 20a of the second transparent conductive film 20 are used in the case of position detection based on the capacitive method.

A description will be given of position detection based on the resistive method in the touch panel of the present embodiment with reference to FIG. 4. Position detection based on the resistive method utilizes the second transparent conductive film 20 and the third transparent conductive film 30. Specifically, position detection is performed in the same or similar manner as the four-wire type of the resistive type. For the purpose of position detection based on the resistive method, the separate areas of the second transparent conductive film 20 preferably have narrow gaps therebetween. As in the case of the third transparent conductive film 30, a transparent conductive film would preferably be formed all over the surface without being divided into separate areas. Since the second transparent conductive film 20 is also used in the capacitive method, the second transparent conductive film 20 is divided into separate areas. In consideration of these, the separate areas 20a and 20b are formed with as small gaps as possible.

In the case of position detection based on the resistive method in the touch panel of the present embodiment, a predetermined voltage is applied between the electrodes 22a and the electrodes 22b to create a potential gradient in the second transparent conductive film 20. The third transparent conductive film 30 is then used to detect a potential at the point of contact with the second transparent conductive film 20, thereby detecting the coordinate of the contact point in the Y-axis direction. Further, a predetermined voltage is applied between the electrodes 32a and the electrodes 32b to create a potential gradient in the third transparent conductive film 30. The second transparent conductive film 20 is then used to detect a potential at the point of contact with the third transparent conductive film 30, thereby detecting the coordinate of the contact point in the X-axis direction. In this manner, the position of the contact point is detected based on the resistive method.

In the touch panel of the present embodiment as described above, the separate areas 20a and 20b of the second transparent conductive film 20 and the third transparent conductive film 30 are used in the case of position detection based on the resistive method.

<Method of Detecting Position>

Figure 24A:
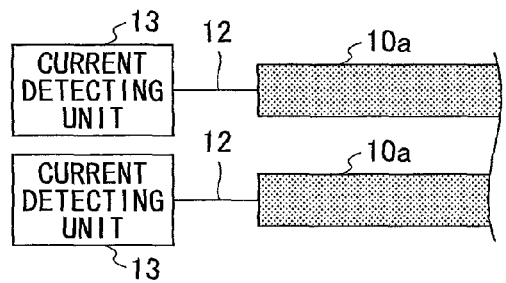
FIGS. 24A through 24D are drawings illustrating a touch panel of a first embodiment according to a third mode of the invention.
Figure 24B:
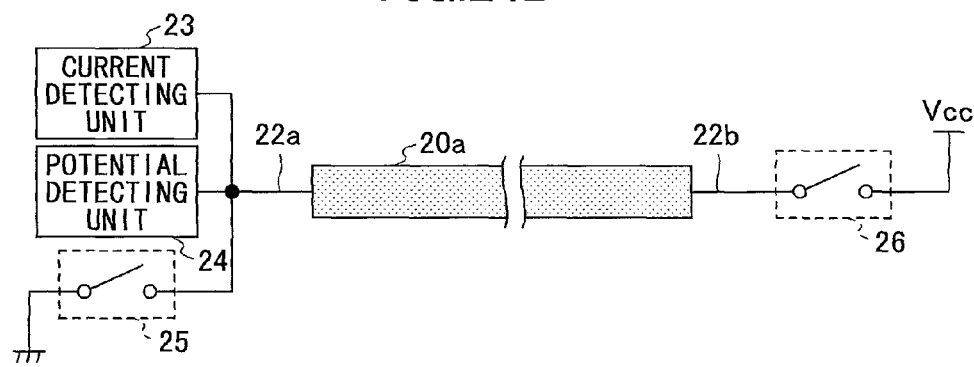
Figure 24C:
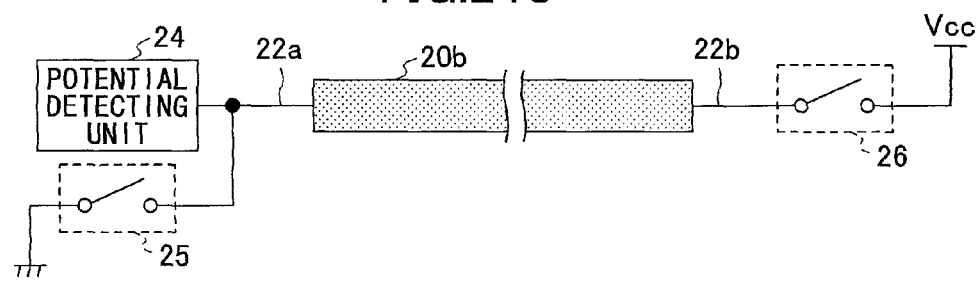
Figure 24D:
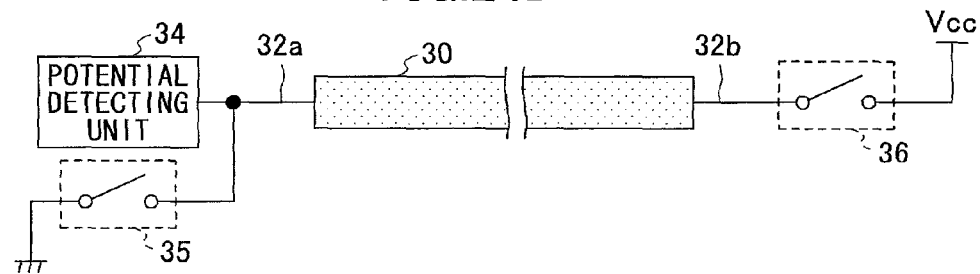
Figure 25A:
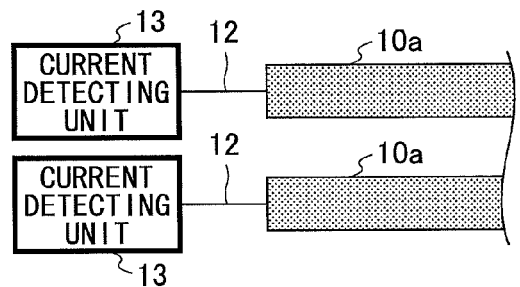
FIGS. 25A through 25D are drawings for illustrating a method of controlling the touch panel of the first embodiment.
Figure 25B:
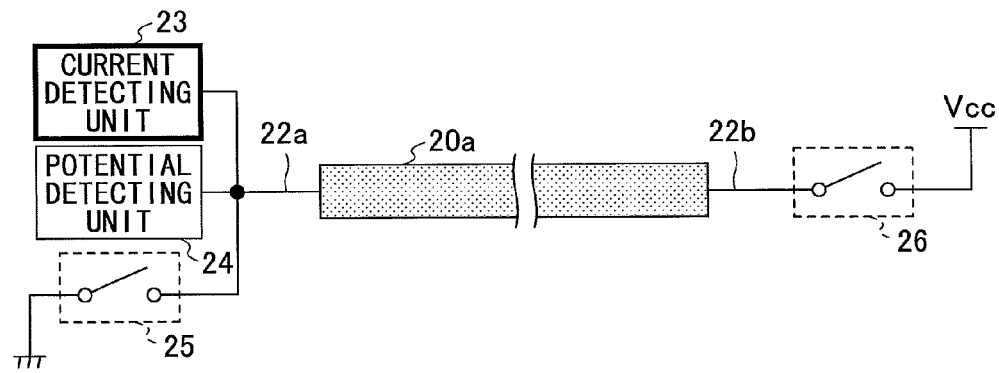
Figure 25C:
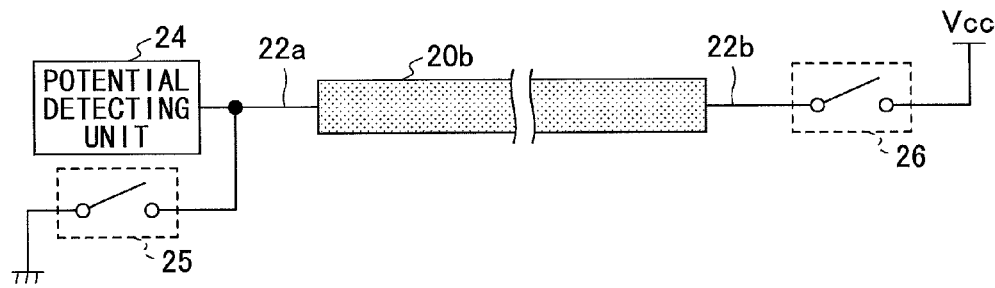
Figure 25D:
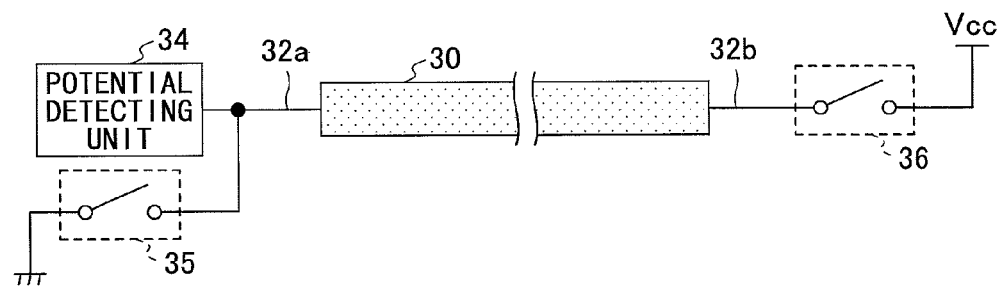
Figure 26A:
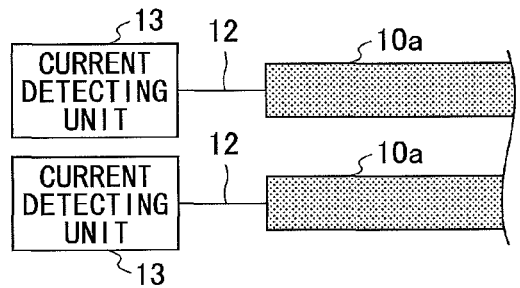
FIGS. 26A through 26D are drawings for illustrating a method of controlling the touch panel of the first embodiment.
Figure 26B:
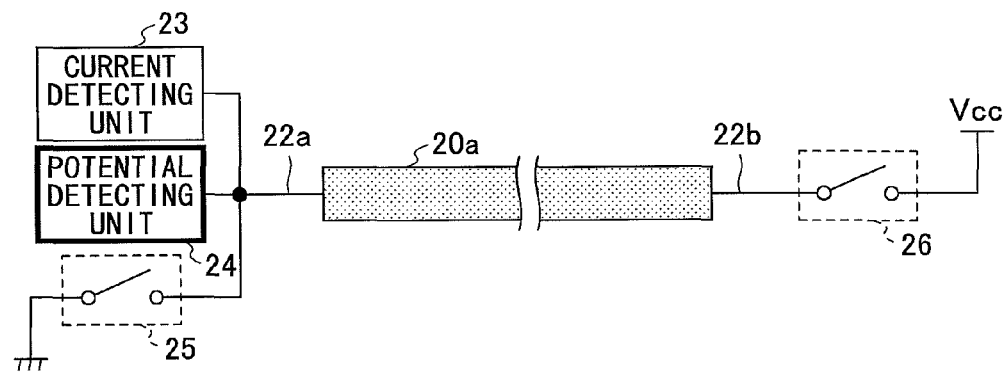
Figure 26C:
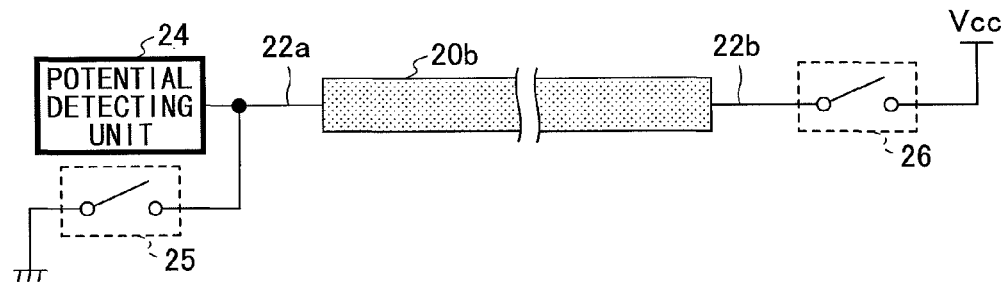
Figure 26D:
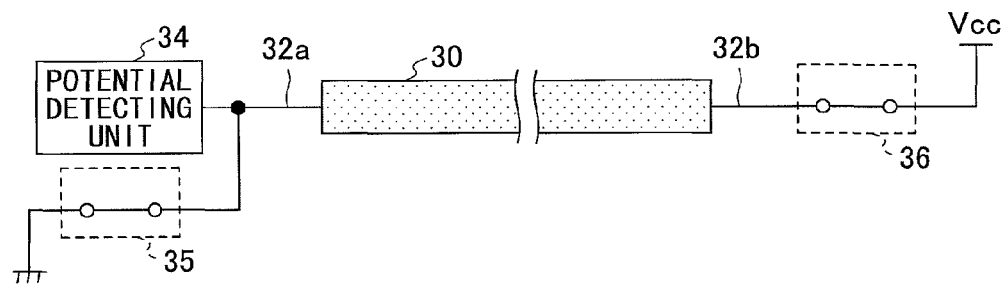
Figure 27A:
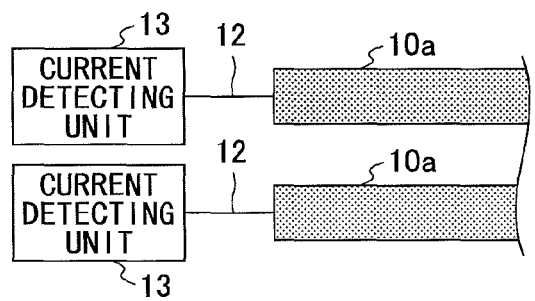
FIGS. 27A through 27D are drawings for illustrating a method of controlling the touch panel of the first embodiment.
Figure 27B:
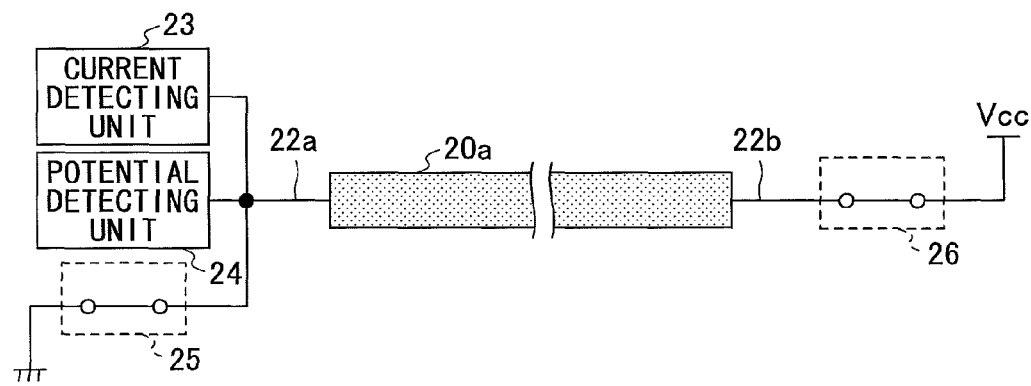
Figure 27C:
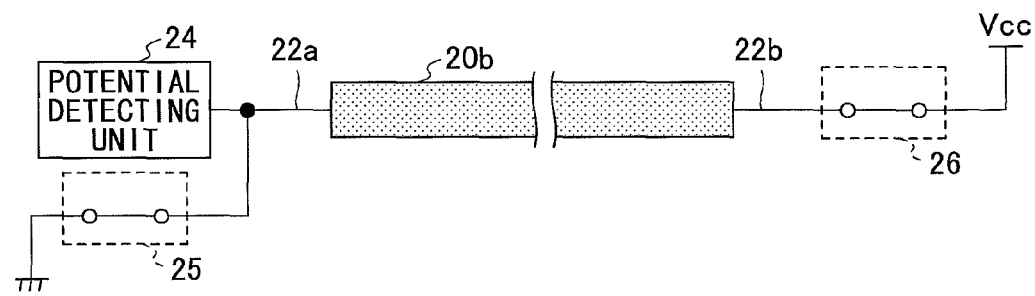
Figure 27D:
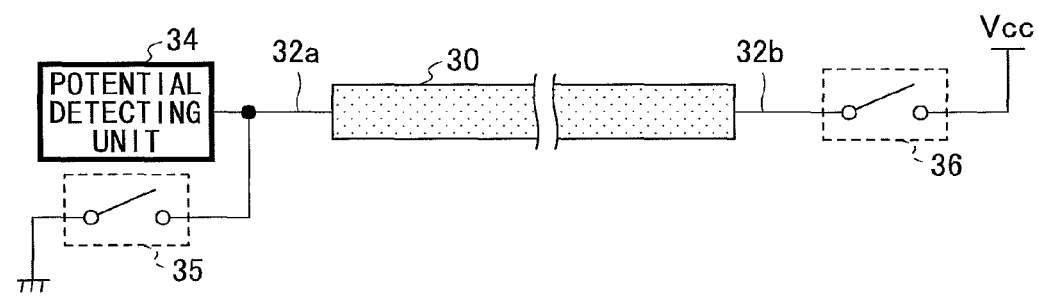

A description will be given of the detection of the position of a contact point in the touch panel of the present embodiment. In the touch panel of the present embodiment, as illustrated in FIG. 24A, each of the separate areas 10a of the first transparent conductive film 10 is connected via the electrode 12 to a current detecting unit 13 for detecting position based on the capacitive method. Further, as illustrated in FIG. 24B, each of the separate areas 20a of the second transparent conductive film 20 is connected through the electrode 22a to a current detecting unit 23 for detecting position based on the capacitive method, to a potential detecting unit 24 for detecting position based on the resistive method, and to a switch 25 for connection to the ground potential, and is also connected through the electrode 22b to a switch 26 for connection to a power supply voltage Vcc. Further, as illustrated in FIG. 24C, each of the separate areas 20b of the second transparent conductive film 20 is connected through the electrode 22a to the potential detecting unit 24 for detecting position based on the resistive method and to the switch 25 for connection to the ground potential, and is also connected through the electrode 22b to the switch 26 for connection to the power supply voltage Vcc. Moreover, as illustrated in FIG. 24D, the third transparent conductive film is connected through the electrode 32a to a potential detecting unit 34 for detecting position based on the resistive method and to a switch 35 for connection to the ground potential, and is also connected through the electrode 32*b* to a switch 36 for connection to the power supply voltage Vcc.

Figure 3:
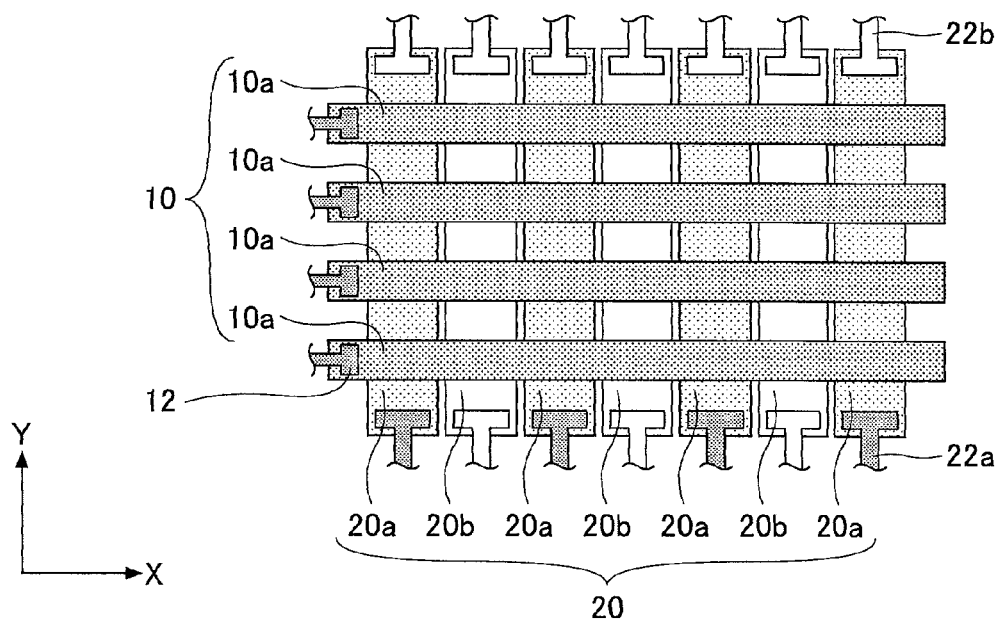
FIG. 3 is a drawing for illustrating a method of driving the touch panel of the first embodiment.

In the touch panel of the present embodiment, the switches 25, 26, 35, and 36 are all set in the open state as illustrated in FIGS. 25A through 25D in order to perform position detection based on the capacitive method as illustrated in FIG. 3. In this state, position detection based on the capacitive method is performed by using the current detecting unit 13 connected to each of the separate areas 10*a* of the first transparent conductive film and the current detecting unit 23 connected to each of the separate areas 20*a* of the second transparent conductive film 20.

Figure 4:
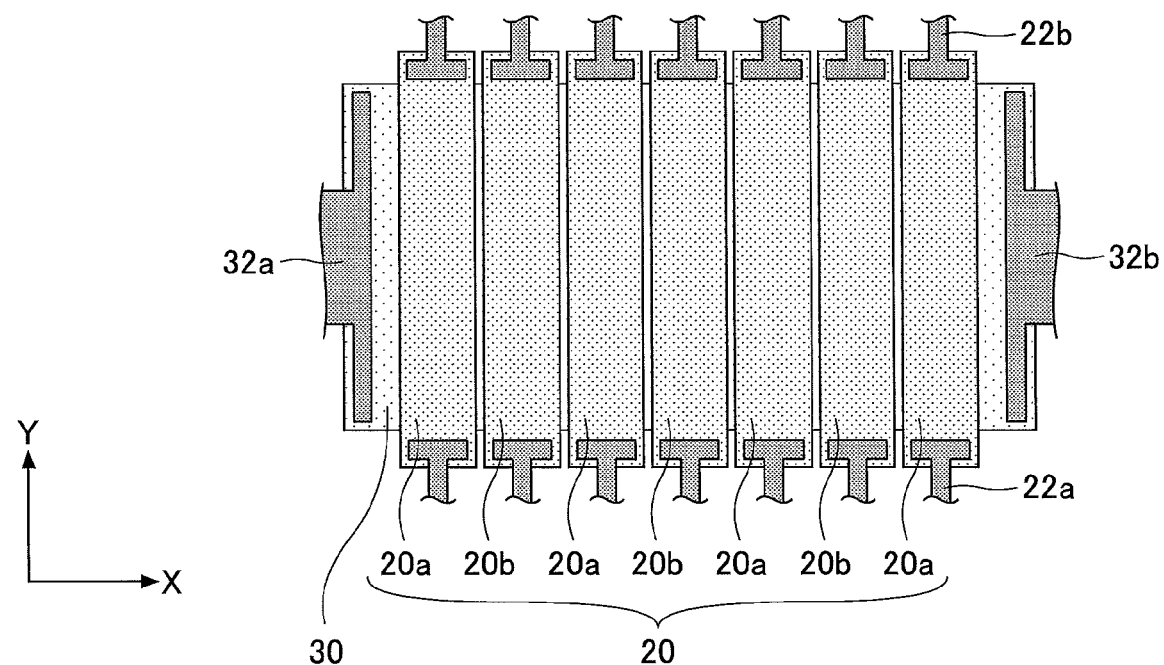
FIG. 4 is a drawing for illustrating a method of driving the touch panel of the first embodiment.

In the touch panel of the present embodiment, the switches 25 and 26 are set in the open state, and the switches 35 and 36 are set in the closed state as illustrated in FIGS. 26A through 26D in order to perform position detection based on the resistive method as illustrated in FIG. 4. In this state, the third transparent conductive film 30 has a potential gradient in the X-axis direction. The potential detecting unit 24 connected to each of the separate areas 20*a* and 20*b* of the second transparent conductive film 20 is used to detect position in the X-axis direction based on the resistive method. Thereafter, the switches 25 and 26 are set in the closed state, and the switches 35 and 36 are set in the open state as illustrated in FIGS. 27A through 27D. In this state, each of the separate areas 20*a* and 20*b* of the second transparent conductive film 20 has a potential gradient in the Y-axis direction. The potential detecting unit 34 connected to the third transparent conductive film is used to detect position in the Y-axis direction based on the resistive method.

<Control Method>

In the following, a method of controlling the touch panel according to the present embodiment will be described. FIG. 28 is a block diagram of a control circuit for controlling the touch panel of the present embodiment. This control circuit includes an MCU (micro control unit) 260, a capacitive-method control unit 261, a capacitive-method detection unit 262, a resistive-method control unit 263, a resistive-method switch unit 264, and a resistive-method detection unit 265. The MCU 260 is connected to a host computer or the like (not shown) through a host interface. The MCU 260 controls the capacitive-method control unit 261, the resistive-method control unit 263, and the resistive-method switch unit 264.

The capacitive-method detection unit 262 is provided for the purpose of position detection based on the capacitive method. The capacitive-method detection unit 262 corresponds to the current detecting unit 13 connected to each of the separate areas 10*a* of the first transparent conductive film and the current detecting unit 23 connected to each of the separate areas 20*a* of the second transparent conductive film 20. The capacitive-method control unit 261 receives measurements detected by the capacitive-method detection unit 262, and converts these measurements into data acceptable to the MCU 260.

The resistive-method detection unit 265 is provided for the purpose of position detection based on the resistive method. The resistive-method detection unit 265 corresponds to the potential detecting unit 24 connected to each of the separate areas 20*a* and 20*b* of the second transparent conductive film 20 and the potential detecting unit connected to the third transparent conductive film 30. The resistive-method control unit 263 receives measurements detected by the resistive-method detection unit 265, and converts these measurements into data acceptable to the MCU 260. Based on a select signal from the MCU 260, the resistive-method switch unit 264 makes and breaks a connection between the resistive-method detection unit 265 and the resistive-method control unit 263. The resistive-method switch unit 264 may be a switch.

Figure 29:
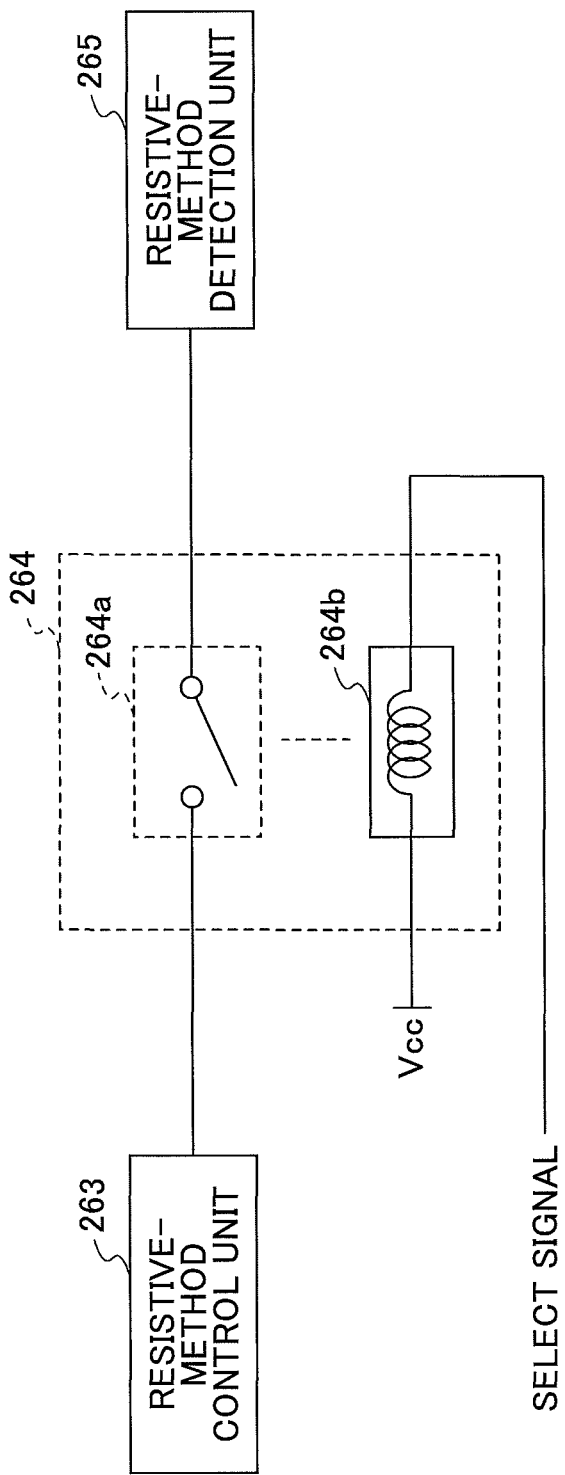
FIG. 29 is a drawing illustrating a resistive-method switch unit.

In the present embodiment, the resistive-method switch unit 264 is implemented by use of a relay as illustrated in FIG. 29. To be more specific, the relay serving as the resistive-method switch unit 264 includes a switch 264*a* and a coil 264*b*. One end of the coil 264*b* receives the select signal from the MCU 260. The other end of the coil 264*b* is connected to the power supply and set to the Vcc potential (i.e., HIGH level).

Figure 30:
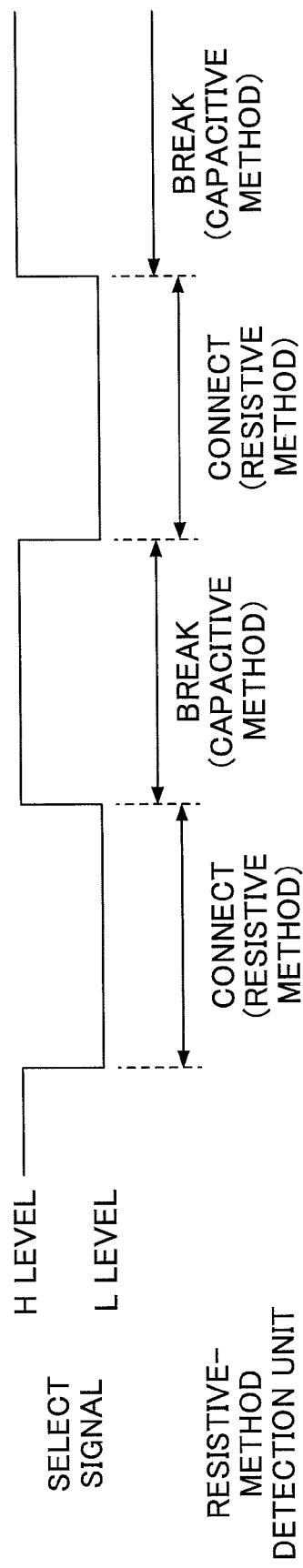
FIG. 30 is a drawing illustrating the resistive-method switch unit.

In order to detect the position of contact in the touch panel of the present embodiment, the MCU 260 generates a select signal as illustrated in FIG. 30 for provision to the end of the coil 264*b*. In the case of the select signal from the MCU 260 being at the L level, an electric current flows through the coil 264*b* to generate a magnetic field, which sets the switch 264*a* in the ON state (i.e. closed state). In this state, the resistive-method control unit 263 and the resistive-method detection unit 265 are connected to each other through the resistive-method switch unit 264, so that position detection is performed based on the resistive method.

In the case of the select signal from the MCU 260 being at the H level, no electric current flows through the coil 264*b*, resulting in the absence of a magnetic field, thereby opening the switch 264*b* (i.e., the OFF state). In this state, the resistive-method control unit 263 and the resistive-method detection unit 265 are separated from each other by the resistive-method switch unit 264, so that the transparent conductive films and the separate areas of the transparent conductive films connected to the resistive-method detection unit 265 are placed in the open state. In this state, position detection based on the capacitive method is performed.

Figure 31:
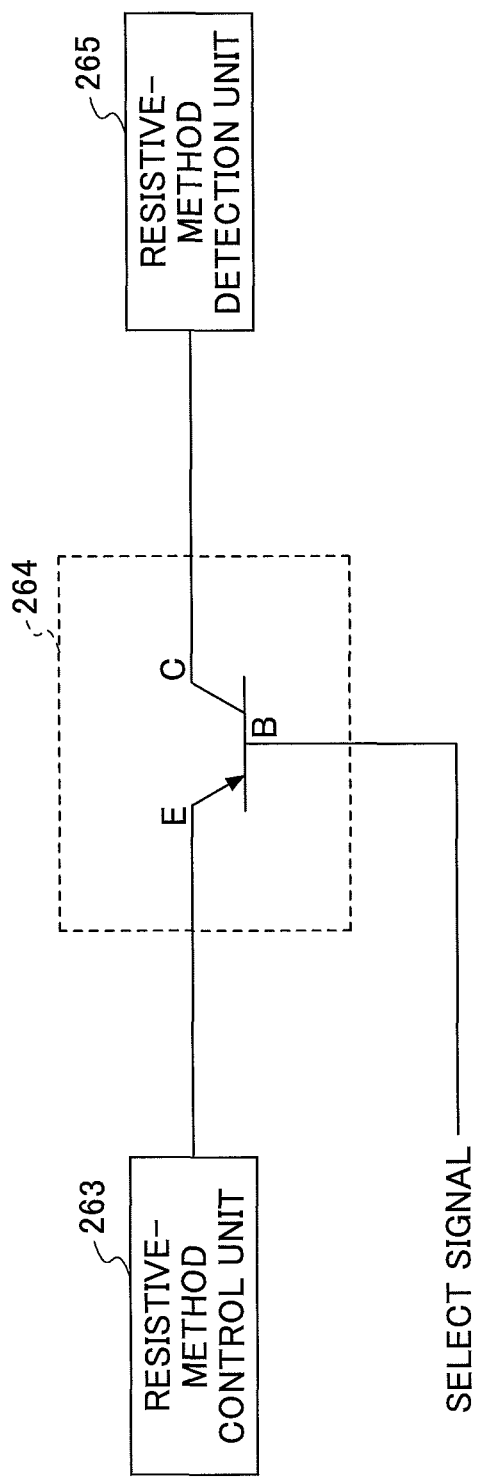
FIG. 31 is a drawing illustrating the resistive-method switch unit.

The above description has been provided with respect to a case in which a relay is used as the resistive-method switch unit 264. Alternatively, a semiconductor device such as a transistor may be used as the resistive-method switch unit 264 as illustrated in FIG. 31. In such a case, the select signal is applied to the base (B) of the transistor serving as the resistive-method switch unit 264. The emitter (E) and the collector (C) of the transistor serving as the resistive-method switch unit 264 are connected to the resistive-method control unit 263 and the resistive-method detection unit 265, respectively. Such a semiconductor device may alternatively be an FET (field effect transistor).

<Method of Detecting Position of Contact in Touch Panel>

Figure 32:
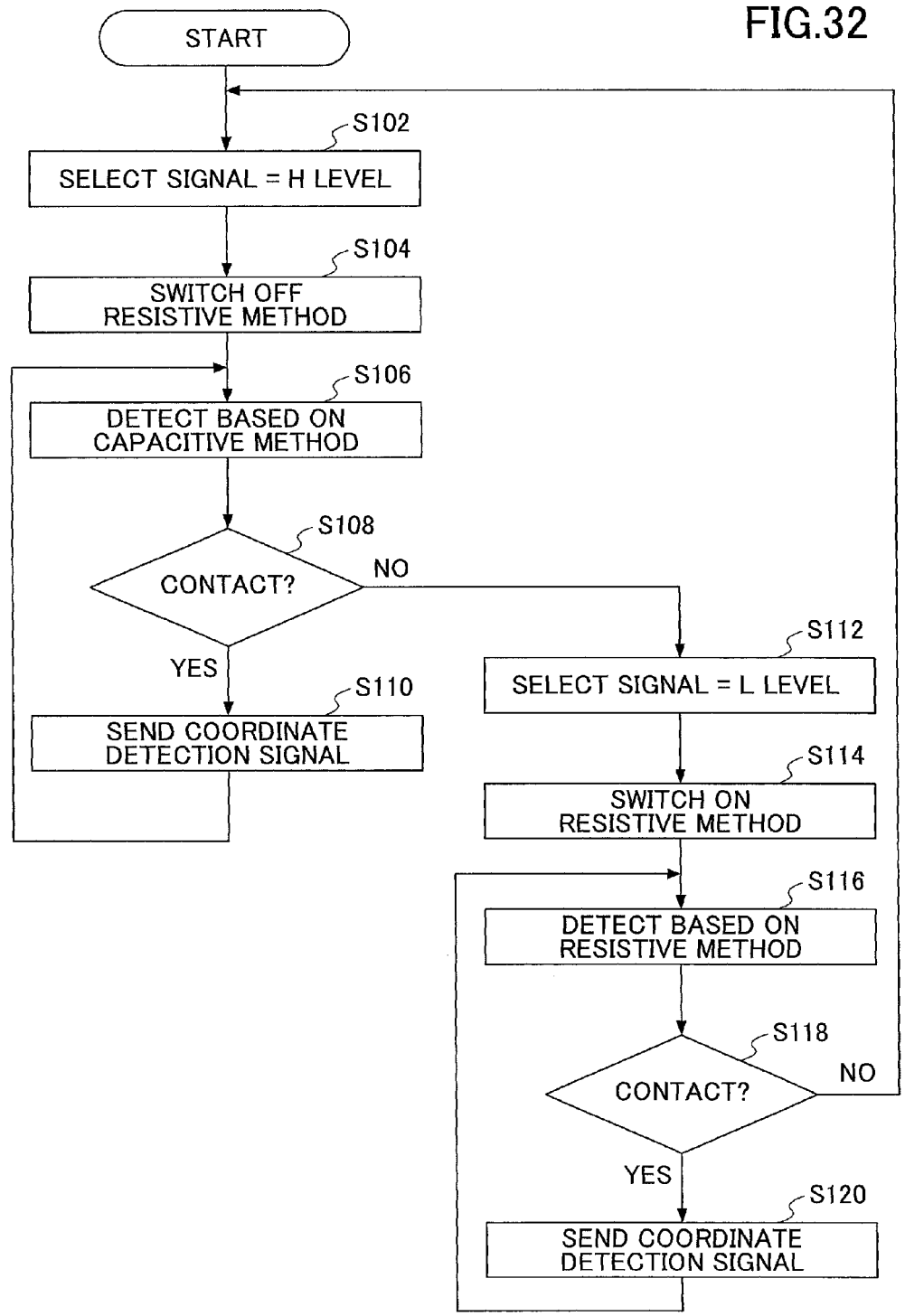
FIG. 32 is a flowchart illustrating a method of detecting position in the touch panel.

In the following, a method of detecting the position of contact in the touch panel according to the present embodiment will be described with reference to FIG. 32.

In step S102, the MCU 260 applies the H-level select signal to the resistive-method switch unit 264 in order to perform position detection based on the capacitive method.

In step S104, the resistive-method switch unit 264 is placed in the OFF state due to the application of the H-level select signal to the resistive-method switch unit 264. In this case, the MCU 260 controls the switches 25, 26, 35, and 36 to place them in the open state as illustrated in FIGS. 25A through 25D.

In step S106, a process of detecting the position of contact based on the capacitive method starts. In this case, the current detecting unit 13 connected to each of the separate areas 10*a* of the first transparent conductive film 10 and the current detecting unit 23 connected to each of the separate areas 20*a* of the second transparent conductive film 20 are used.

In step S108, a check is made as to whether a touch detectable in the capacitive method is present. Specifically, a check is made as to whether a touch detectable in the capacitive method is in existence based on the amount of currents detected by the current detecting units 13 and 23. When the check finds that a touch detectable by the capacitive method is present, the procedure proceeds to step S110. When the check finds that no touch detectable by the capacitive method is present, the procedure proceeds to step S112.

In step S110, the coordinates of the point of touch are calculated based on the capacitive method by using the amounts of currents detected by the current detecting units 13 and 23. The coordinates of the point of touch are then transmitted to the host computer or the like.

In step S112, the MCU 260 applies the L-level select signal to the resistive-method switch unit 264 in order to perform position detection based on the resistive method.

In step S114, the resistive-method switch unit 264 is placed in the ON state due to the application of the L-level select signal to the resistive-method switch unit 264. In this case, the MCU 260 controls the switches 25, 26, 35, and 36 to place the switches 25 and 36 in the open state and the switches 35 and 36 in the closed state as illustrated in FIGS. 26A through 26D, thereby generating a potential gradient in the X-axis direction.

In step S116, a process of detecting the position of contact based on the resistive method starts. In this case, the potential detecting unit 24 connected to each of the separate areas 20a and 20b of the second transparent conductive film 20 are used.

In step S118, a check is made as to whether a touch detectable in the resistive method is present. Specifically, a check is made as to whether a touch detectable in the resistive method is in existence based on the potential detected by the potential detecting unit 24. When the check finds that a touch detectable by the resistive method is present, the procedure proceeds to step S120. When the check finds that no touch detectable by the resistive method is present, the procedure proceeds to step S102.

In step S120, the X coordinate of the position of touch is calculated based on the resistive method by using the potential detected by the potential detecting unit 24. After this, the MCU 260 sets the switches 25 and 26 in the closed state and the switches 35 and 36 in the open state as illustrated in FIGS. 27A through 27D, thereby generating a potential gradient in the Y-axis direction. The potential detecting unit 34 connected to the third transparent conductive film 30 then detects potential, followed by calculating the Y coordinate of the position of the touch based on the resistive method by using the detected potential. In this manner, the coordinates of the position of contact are calculated based on the resistive method, and are transmitted to the host computer or the like.

In the present embodiment, the process of detecting the position of contact based on the capacitive method may be referred to as a first detection process, and the process of detecting the position of contact based on the resistive method may be referred to as a second detection process.

In the manner as described above, position detection is performed in the touch panel of the present embodiment. This position detecting method used in the touch panel successfully detects position with respect to any object coming into contact. Further, position is detectable by use of a simple method in the touch panel that can detect position upon a slight touch.

[Second Embodiment]

The second embodiment of the third mode of the invention will be described with reference to FIG. 13 through FIG. 16 illustrating the first embodiment of the second mode of the invention.

In the following, a description will be given of a touch panel according to a second embodiment. As illustrated in FIG. 13 and FIG. 14, the touch panel of the present embodiment includes the first transparent conductive film 110 and the second transparent conductive film 120. In the present embodiment, the position of a contact point (i.e., contact position) is detected by the capacitive method using the first transparent conductive film 110 and the second transparent conductive film 120, which are also used to detect the position of the contact point (i.e. contact position) by use of the resistive method. In the present embodiment, the first transparent conductive film 110 serves as a first conductive film, and the second transparent conductive film 120 serves as a second conductive film.

The first transparent conductive film 110 is formed on a surface of the first transparent substrate 111, and has a plurality of separate areas 110a and 110b each having a strip shape that has the length direction thereof extending in the X-axis direction. The separate areas 110a and 110b are alternately arranged side by side in the Y-axis direction. The opposite ends of each of the separate areas 110a and 110b, i.e., the ends facing each other in the X-axis direction, have the electrodes 112a and 112b connected thereto, respectively. Although reference numerals are omitted from illustration, the electrodes 112a and 112b are formed on each of the separate areas 110a and 110b.

The second transparent conductive film 120 is formed on a surface of the second transparent substrate 121, and has a plurality of separate areas 120a and 120b each having a strip shape that has the length direction thereof extending in the Y-axis direction. The separate areas 120a and 120b are alternately arranged side by side in the X-axis direction. The opposite ends of each of the separate areas 120a and 120b, i.e., the ends facing each other in the Y-axis direction, have electrodes the 122a and 122b connected thereto, respectively. Although reference numerals are omitted from illustration, the electrodes 22a and 22b are formed on each of the separate areas 20a and 20b.

The first transparent conductive film 110 and the second transparent conductive film 120 are made of electrically conductive transparent material that is metal oxide such as ITO or AZO. The first transparent conductive film 110 and the second transparent conductive film 120 may be made of a material other than metal oxide as long as they are made of conductive, transparent material. Namely, any material suffices as long as it is electrically conductive and transmits light. Specifically, conductive polymer, metal nanowire, carbon nanotube, and the like, which are referred to as a substitute for ITO or the like, may be used.

The first transparent substrate 111 is made of transparent resin material such as PET, which is a material easy to bend. The second transparent substrate 121 is made of transparent inorganic material such as glass or transparent resin material such as plastics.

In the touch panel of the present embodiment, the first transparent substrate 111 is bonded through an adhesive member 142 such as a frame-shape double-faced tape to the second transparent substrate 121 such that the surface of the first transparent substrate 111 having the first transparent conductive film 110 disposed thereon faces the surface of the second transparent substrate 121 having the second transparent conductive film 120 disposed thereon. This arrangement creates the gap 143 between the first transparent substrate 111 and the second transparent substrate 121, so that the first transparent conductive film 110 and the second transparent conductive film 120 face each other across the gap 143.

<Drive Method>

In the following, a method of driving the touch panel according to the present embodiment will be described. In the touch panel of the present embodiment, position is detected by utilizing the capacitive method and the resistive method alternately in a time-division manner. Namely, position detection based on the resistive method is not performed when position detection based on the capacitive method is being performed. Position detection based on the capacitive method is not performed when position detection based on the resistive method is being performed.

A description will be given of position detection based on the capacitive method in the touch panel of the present embodiment with reference to FIG. 15. Position detection based on the capacitive method utilizes the first transparent conductive film 110 and the second transparent conductive film 120 to detect the position of a contact point. For the purpose of position detection based on the capacitive method, the separate areas of each of the first transparent conductive film 110 and the second transparent conductive film 120 are preferably spaced apart with gaps. In the present embodiment, the first transparent conductive film 110 and the second transparent conductive film 120 are used in the resistive method as well as in the capacitive method. As was previously described, the first transparent conductive film 110 has the separate areas 110a and 110b, and the second transparent conductive film 120 has the separate areas 120a and 120b. In the case of position detection based on the capacitive method, only the separate areas 110a among the separate areas 110a and 110b are used, and only the separate areas 120a among the separate areas 120a and 120b are used. Namely, in the case of position detection based on the capacitive method in the touch panel of the present embodiment, the separate areas 110a are driven through the electrodes 112a, but the separate areas 110b are not driven through the electrodes. The separate areas 110b are not even coupled to the ground, and stay in the open state, i.e., in the floating state. Similarly, the separate areas 120a are driven by the electrodes 122b but the separate areas 120b are not driven by the electrodes 122b. The separate areas 120b are not even coupled to the ground, and stay in the open state, i.e., in the floating state.

In the touch panel of the present embodiment as described above, the separate areas 110a of the first transparent conductive film 110 and the separate areas 120a of the second transparent conductive film 120 are used in the case of position detection based on the capacitive method.

A description will be given of position detection based on the resistive method in the touch panel of the present embodiment with reference to FIG. 16. Position detection based on the resistive method utilizes the first transparent conductive film 110 and the second transparent conductive film 120. Specifically, position detection is performed in the same or similar manner as the four-wire type of the resistive type. For the purpose of position detection based on the resistive method, the separate areas of the first transparent conductive film 110 and the second transparent conductive film 120 preferably have narrow gaps therebetween. As a matter of fact, a transparent conductive film would preferably be formed all over the surface without being divided into separate areas. Since the first transparent conductive film 110 and the second transparent conductive film 120 are also used in the capacitive method, these films are divided into separate areas. In consideration of this, gaps between the separate areas 110a and the adjacent separate areas 110b as well as gaps between the separate areas 120a and the adjacent separate areas 120b are formed to be as narrow as possible.

In the case of position detection based on the resistive method in the touch panel of the present embodiment, a predetermined voltage is applied between the electrodes 112a and the electrodes 112b to create a potential gradient in the first transparent conductive film 110. The second transparent conductive film 120 is then used to detect a potential at the point of contact with the first transparent conductive film 110, thereby detecting the coordinate of the contact point in the X-axis direction. Further, a predetermined voltage is applied between the electrodes 122a and the electrodes 122b to create a potential gradient in the second transparent conductive film 120. The first transparent conductive film 110 is then used to detect a potential at the point of contact with the second transparent conductive film 120, thereby detecting the coordinate of the contact point in the Y-axis direction. In this manner, the position of the contact point is detected based on the resistive method.

In the touch panel of the present embodiment as described above, the separate areas 110a and 110b of the first transparent conductive film 110 and the separate areas 120a and 120b of the second transparent conductive film 120 are used in the case of position detection based on the resistive method.

<Method of Detecting Position>

Figure 33A:
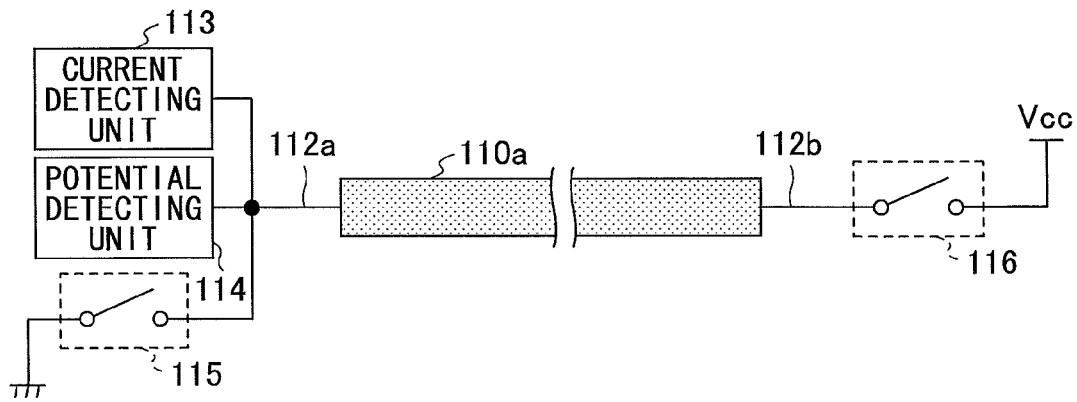
FIGS. 33A through 33D are drawings illustrating the touch panel of a second embodiment.
Figure 33B:
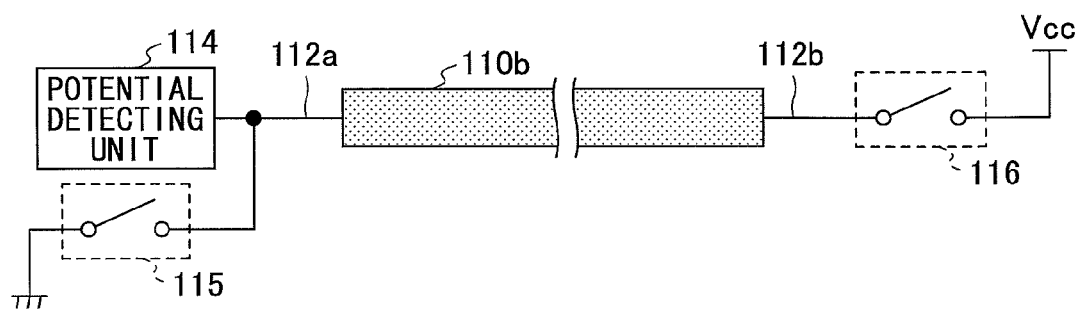
Figure 33C:
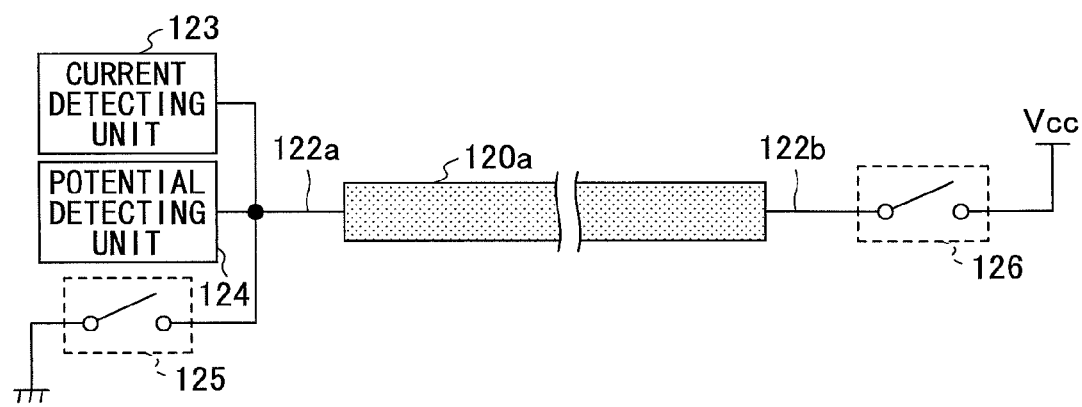
Figure 33D:
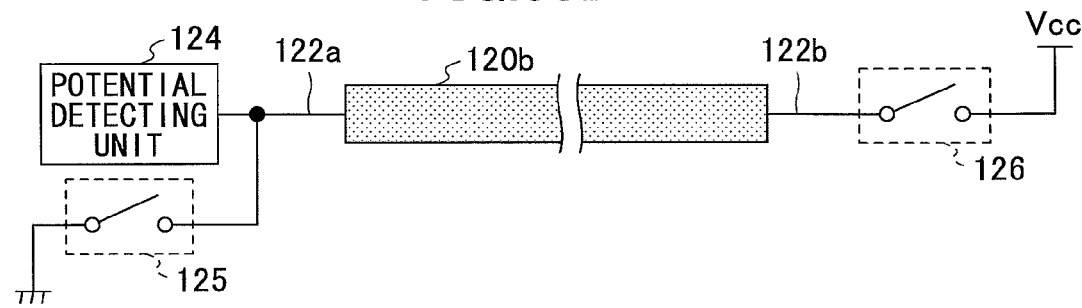
Figure 34A:
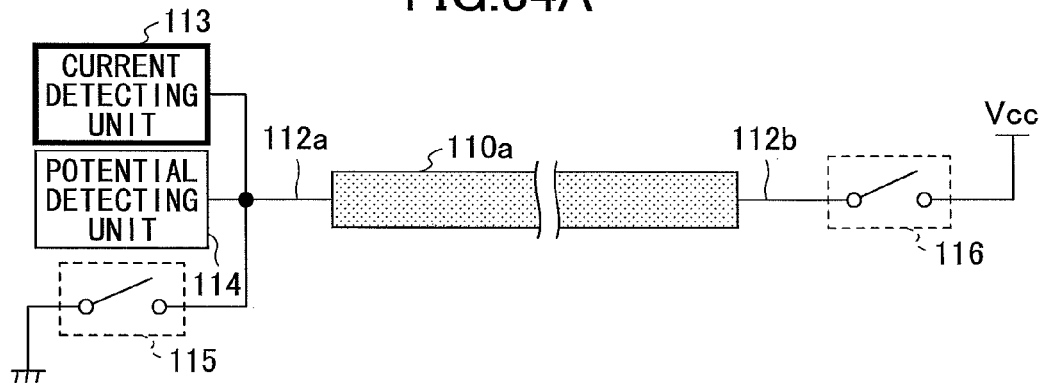
FIGS. 34A through 34D are drawings for illustrating a method of controlling the touch panel of the second embodiment.
Figure 34B:
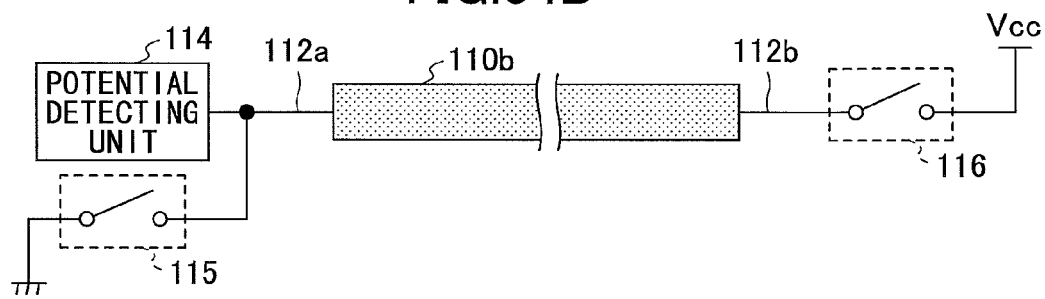
Figure 34C:
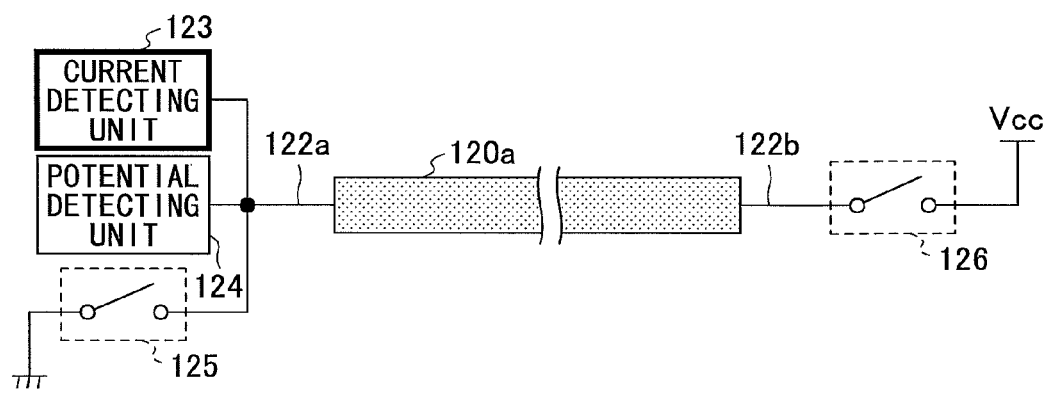
Figure 34D:
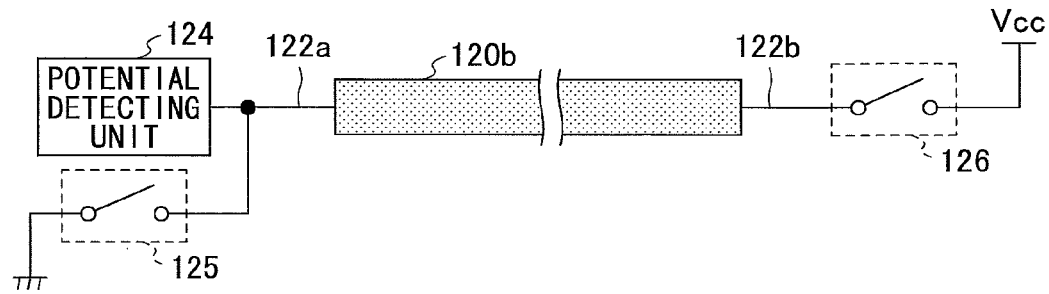
Figure 35A:
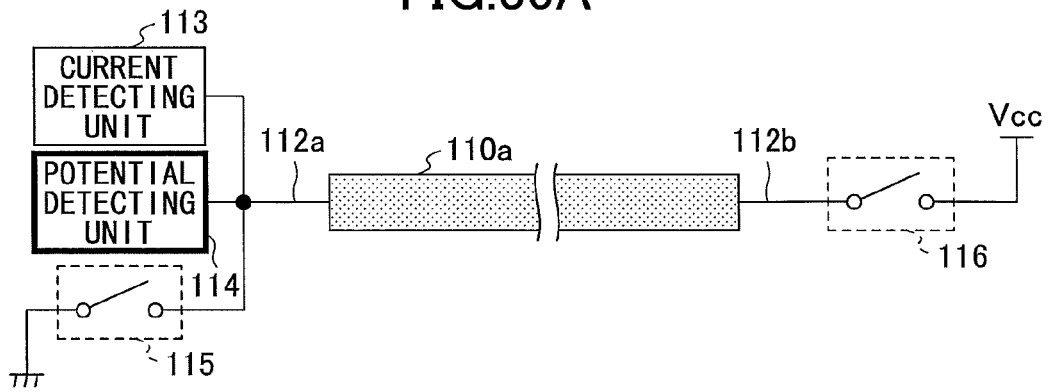
FIGS. 35A through 35D are drawings for illustrating a method of controlling the touch panel of the second embodiment.
Figure 35B:
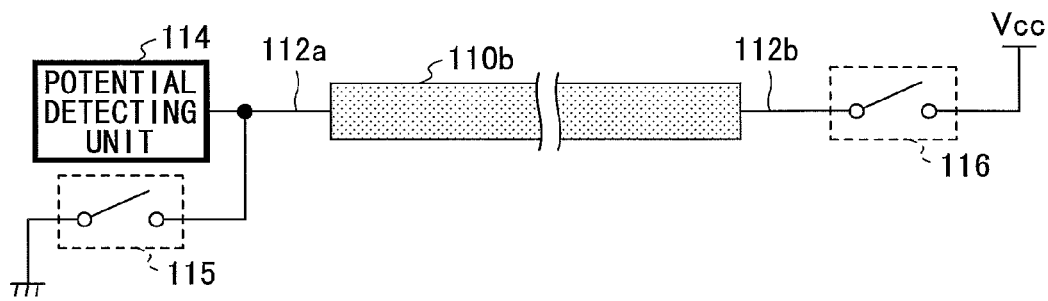
Figure 35C:
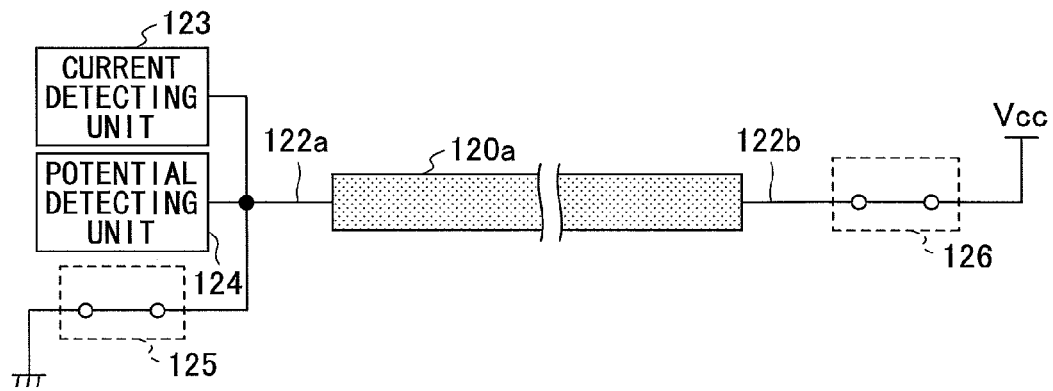
Figure 35D:
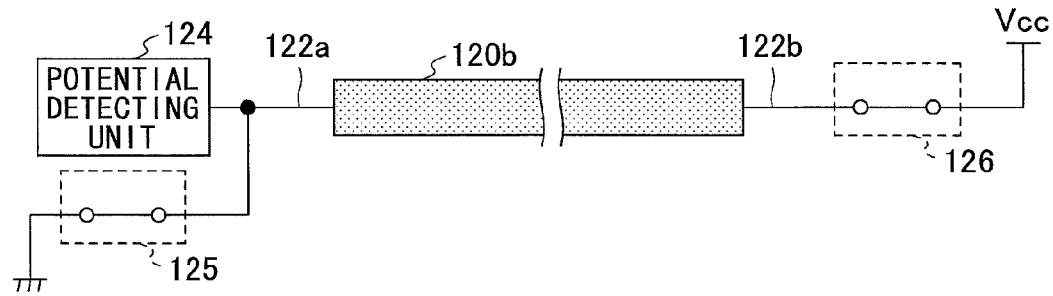
Figure 36A:
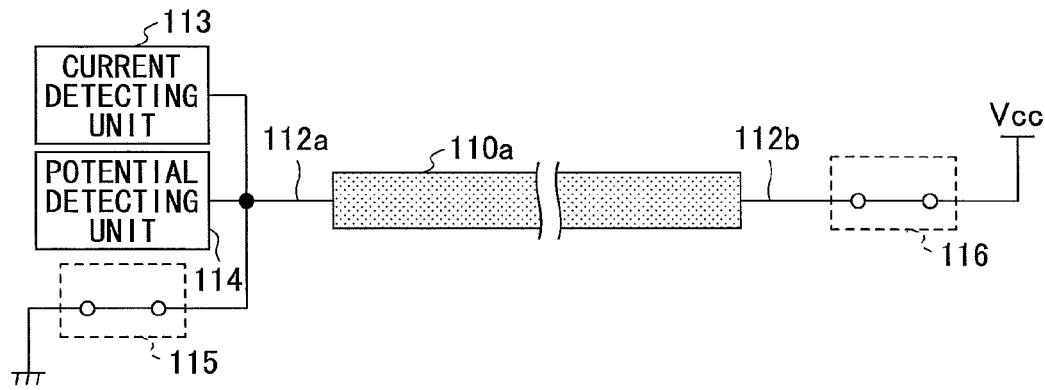
FIGS. 36A through 36D are drawings for illustrating a method of controlling the touch panel of the second embodiment.
Figure 36B:
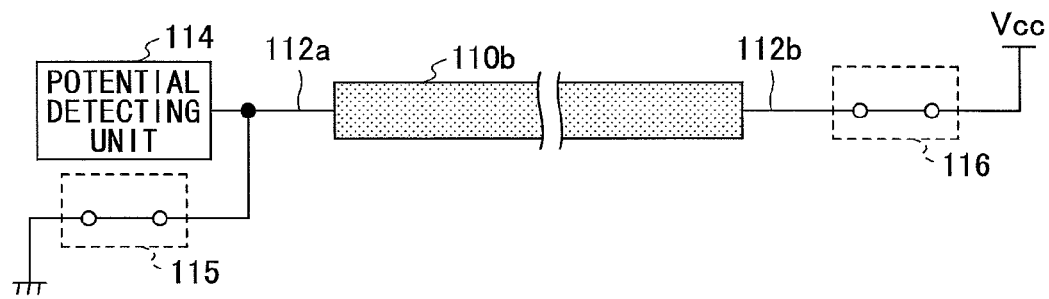
Figure 36C:
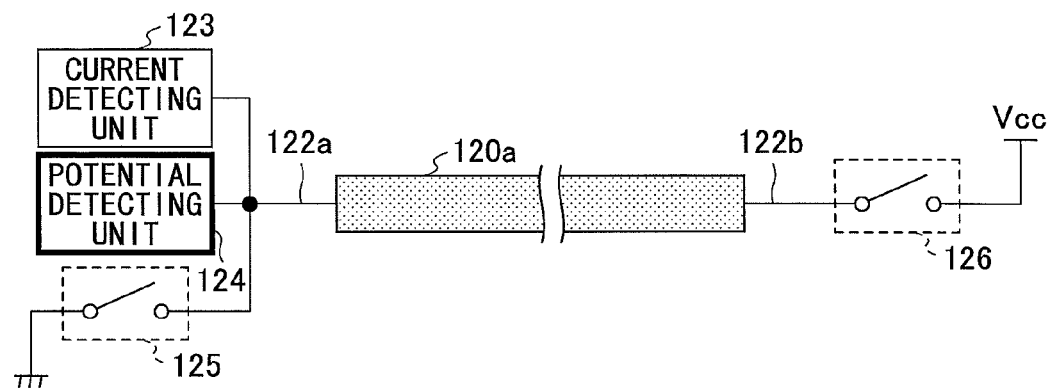
Figure 36D:
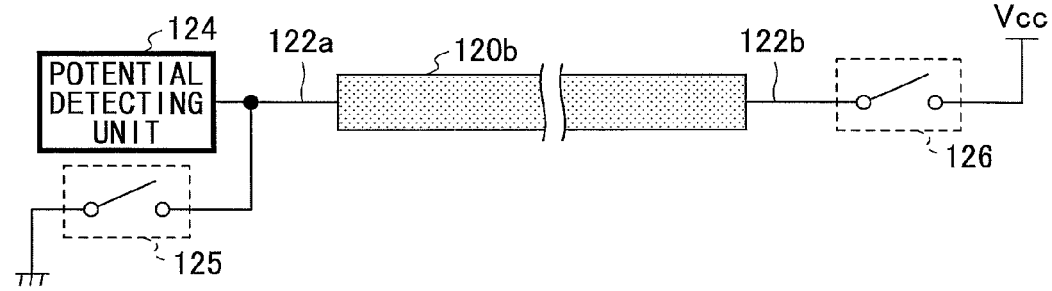

A description will be given of the detection of the position of a contact point in the touch panel of the present embodiment. In the touch panel of the present embodiment, as illustrated in FIG. 33A, each of the separate areas 110a of the first transparent conductive film 110 is connected through the electrode 112a to a current detecting unit 113 for detecting position based on the capacitive method, to a potential detecting unit 114 for detecting position based on the resistive method, and to a switch 115 for connection to the ground potential, and is also connected through the electrode 112b to a switch 116 for connection to a power supply voltage Vcc. Further, as illustrated in FIG. 33B, each of the separate areas 110b of the first transparent conductive film 110 is connected through the electrode 112a to the potential detecting unit 114 for detecting position based on the resistive method and to the switch 115 for connection to the ground potential, and is also connected through the electrode 112b to the switch 116 for connection to the power supply voltage Vcc. Further, as illustrated in FIG. 33C, each of the separate areas 120a of the second transparent conductive film 120 is connected through the electrode 122a to a current detecting unit 123 for detecting position based on the capacitive method, to a potential detecting unit 124 for detecting position based on the resistive method, and to a switch 125 for connection to the ground potential, and is also connected through the electrode 122b to a switch 126 for connection to the power supply voltage Vcc. Moreover, as illustrated in FIG. 33D, each of the separate areas 120b of the second transparent conductive film 120 is connected through the electrode 122a to the potential detecting unit 124 for detecting position based on the resistive method and to the switch 125 for connection to the ground potential, and is also connected through the electrode 122b to the switch 126 for connection to the power supply voltage Vcc.

Figure 15:
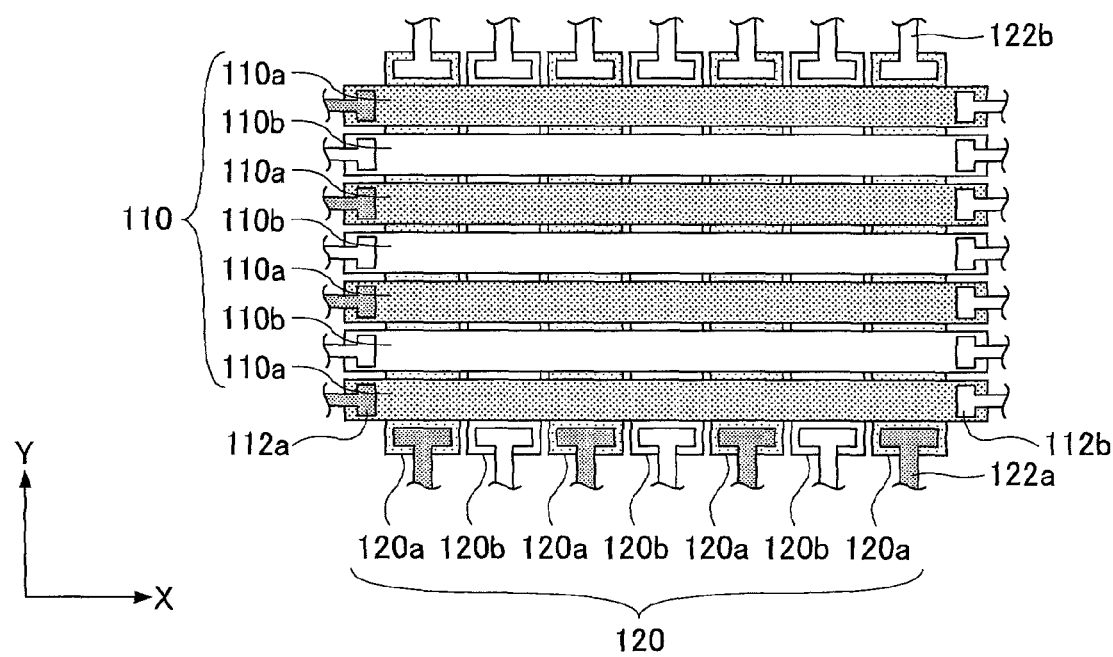
FIG. 15 is a drawing for illustrating a method of driving the touch panel of the first embodiment.

In the touch panel of the present embodiment, the switches 115, 116, 125, and 126 are all set in the open state as illustrated in FIGS. 34A through 34D in order to perform position detection based on the capacitive method as illustrated in FIG. 15. In this state, position detection based on the capacitive method is performed by using the current detecting unit 113 connected to each of the separate areas 110a of the first transparent conductive film 110 and the current detecting unit 123 connected to each of the separate areas 120a of the second transparent conductive film 120.

Figure 16:
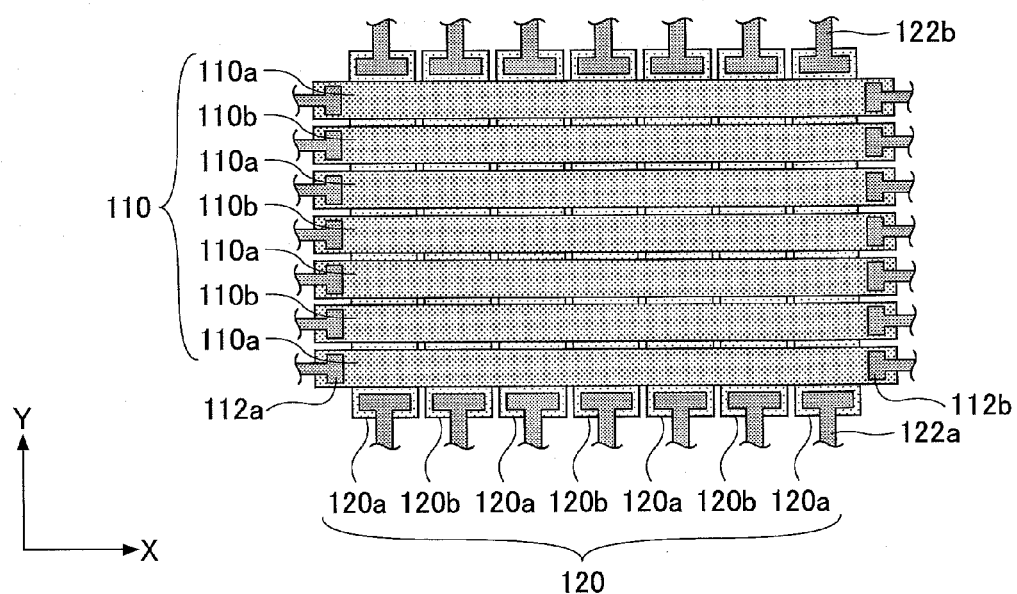
FIG. 16 is a drawing for illustrating a method of driving the touch panel of the first embodiment.

In the touch panel of the present embodiment, the switches 115 and 116 are set in the open state, and the switches 125 and 126 are set in the closed state as illustrated in FIGS. 35A through 35D in order to perform position detection based on the resistive method as illustrated in FIG. 16. In this state, the second transparent conductive film 120 has a potential gradient in the Y-axis direction. The potential detecting unit 114 connected to each of the separate areas 110a and 110b of the first transparent conductive film 110 is used to detect position in the Y-axis direction based on the resistive method. Thereafter, the switches 115 and 116 are set in the closed state, and the switches 125 and 126 are set in the open state as illustrated in FIGS. 36A through 36D. In this state, each of the separate areas 110a and 110b of the first transparent conductive film 110 has a potential gradient in the X-axis direction. The potential detecting unit 124 connected to each of the separate areas 120a and 120b of the second transparent conductive film 120 is used to detect position in the X-axis direction based on the resistive method.

The method of controlling the touch panel in the present embodiment is the same as or similar to the method of controlling the touch panel in the first embodiment, and a control circuit the same as or similar to the one illustrated in FIG. 28 is used. In the present embodiment, the capacitive-method detection unit 262 corresponds to the current detecting unit 113 connected to each of the separate areas 110a of the first transparent conductive film 110 and the current detecting unit 123 connected to each of the separate areas 120a of the second transparent conductive film 120. Further, the resistive-method detection unit 265 corresponds to the potential detecting unit 114 connected to each of the separate areas 110a and 110b of the first transparent conductive film 110 and the potential detecting unit 124 connected to each of the separate areas 120a and 120b of the second transparent conductive film 120.

<Method of Detecting Position of Contact in Touch Panel>

In the following, a method of detecting the position of contact in the touch panel according to the present embodiment will be described with reference to FIG. 32.

In step S102, the MCU 260 applies the H-level select signal to the resistive-method switch unit 264 in order to perform position detection based on the capacitive method.

In step S104, the resistive-method switch unit 264 is placed in the OFF state due to the application of the H-level select signal to the resistive-method switch unit 264. In this case, the MCU 260 controls the switches 115, 116, 125, and 126 to place them in the open state as illustrated in FIGS. 34A through 34D.

In step S106, a process of detecting the position of contact based on the capacitive method starts. In this case, the current detecting unit 113 connected to each of the separate areas 110a of the first transparent conductive film 110 and the current detecting unit 123 connected to each of the separate areas 120a of the second transparent conductive film 120 are used.

In step S108, a check is made as to whether a touch detectable in the capacitive method is present. Specifically, a check is made as to whether a touch detectable in the capacitive method is in existence based on the amount of currents detected by the current detecting units 113 and 123. When the check finds that a touch detectable by the capacitive method is present, the procedure proceeds to step S110. When the check finds that no touch detectable by the capacitive method is present, the procedure proceeds to step S112.

In step S110, the coordinates of the point of touch are calculated based on the capacitive method by using the amounts of currents detected by the current detecting units 113 and 123. The coordinates of the point of touch are then transmitted to the host computer or the like.

In step S112, the MCU 260 applies the L-level select signal to the resistive-method switch unit 264 in order to perform position detection based on the resistive method.

In step S114, the resistive-method switch unit 264 is placed in the ON state due to the application of the L-level select signal to the resistive-method switch unit 264. In this case, the MCU 260 controls the switches 115, 116, 125, and 126 to place the switches 115 and 116 in the open state and the switches 125 and 126 in the closed state as illustrated in FIGS. 35A through 35D, thereby generating a potential gradient in the Y-axis direction.

In step S116, a process of detecting the position of contact based on the resistive method starts. In this case, the potential detecting unit 114 connected to each of the separate areas 110a and 110b of the first transparent conductive film 110 are used.

In step S118, a check is made as to whether a touch detectable in the resistive method is present. Specifically, a check is made as to whether a touch detectable in the resistive method is in existence based on the potential detected by the potential detecting unit 114. When the check finds that a touch detectable by the resistive method is present, the procedure proceeds to step S120. When the check finds that no touch detectable by the resistive method is present, the procedure proceeds to step S102.

In step S120, the Y coordinate of the position of touch is calculated based on the resistive method by using the potential detected by the potential detecting unit 114. After this, the MCU 260 sets the switches 115 and 116 in the closed state and the switches 125 and 126 in the open state as illustrated in FIGS. 36A through 36D, thereby generating a potential gradient in the X-axis direction. The potential detecting unit 124 connected to each of the separate areas 120a and 120b of the second transparent conductive film 120 then detects potential, followed by calculating the X coordinate of the position of the touch based on the resistive method by using the detected potential. In this manner, the coordinates of the position of contact are calculated based on the resistive method, and are transmitted to the host computer or the like.

In the present embodiment, the process of detecting the position of contact based on the capacitive method may be referred to as a first detection process, and the process of detecting the position of contact based on the resistive method may be referred to as a second detection process.

In the manner as described above, position detection is performed in the touch panel of the present embodiment. This position detecting method used in the touch panel successfully detects position with respect to any object coming into contact. Further, position is detectable by use of a simple method in the touch panel that can detect position upon a slight touch.

Configurations other than those described above are the same as or similar to those of the first embodiment.

Further, although the present invention is not limited to these embodiments, but various variations and modifications may be made without departing from the scope of the present invention.

The present application claims foreign priority to Japanese Patent Applications No. 2012-031101 filed on Feb. 15, 2012, No. 2012-031102 filed on Feb. 15, 2012, and No. 2012-039313 filed on Feb. 24, 2012 with the Japan Patent Office, the entire contents of which are hereby incorporated by reference.

What is claimed is:

1. A touch panel, comprising:
a first substrate having first conductive films formed thereon, each of which has a strip shape with a length direction thereof extending in a first direction and has an electrode at one end thereof in the first direction;
a second substrate having second conductive films formed thereon, each of which has a strip shape with a length direction thereof extending in a second direction perpendicular to the first direction, and has electrodes at opposite ends thereof in the second direction; and
a third substrate having a third conductive film of a planar shape formed thereon,
wherein the first substrate, the second substrate, and the third substrate are stacked one over another in the order named,
wherein only every other one of the second conductive films are driven when performing position detection by use of the first conductive film and the second conductive film, and wherein all of the second conductive films are driven when performing position detection by use of the second conductive film and the third conductive film.

2. A touch panel, comprising:
a first conductive film having a plurality of separate areas, each of which has a strip shape with a length direction thereof extending in a first direction; and
a second conductive film having a plurality of separate areas, each of which has a strip shape with a length direction thereof extending in a second direction substantially perpendicular to the first direction,
wherein the separate areas of the first conductive film are arranged side by side in the second direction, and the separate areas of the second conductive film are arranged side by side in the first direction,
wherein position detection based on a capacitive method is performed by using the first conductive film and the second conductive film,
wherein position detection based on a resistive method is performed by detecting a potential of a position of contact between the first conductive film and the second conductive film, and
wherein only some but not all of the separate areas of the first conductive film are connected to a current detecting unit, and each of the separate areas of the first conductive film is connected to a potential detecting unit.

3. The touch panel as claimed in claim 2, wherein the first conductive film is formed on one surface of a first transparent substrate, and the second conductive film is formed on one surface of a second transparent substrate, and wherein the one surface of the first transparent substrate and the one surface of the second transparent substrate face each other.

4. The touch panel as claimed in claim 2, wherein only some but not all of the separate areas of the second conductive film are connected to a current detecting unit, and each of the separate areas of the second conductive film is connected to a potential detecting unit.

5. The touch panel as claimed in claim 4, wherein each of the separate areas of the second conductive film is connected to a switch configured to generate a potential gradient in each of the separate areas of the second conductive film in the second direction.

6. The touch panel as claimed in claim 2, wherein each of the separate areas of the first conductive film is connected to a switch configured to generate a potential gradient in each of the separate areas of the first conductive film in the first direction.

7. A touch panel, comprising:
a first conductive film having a plurality of separate areas, each of which has a strip shape with a length direction thereof extending in a first direction;
a second conductive film having a plurality of separate areas, each of which has a strip shape with a length direction thereof extending in a second direction substantially perpendicular to the first direction; and
a third conductive film,
wherein the separate areas of the first conductive film are arranged side by side in the second direction, and the separate areas of the second conductive film are arranged side by side in the first direction,
wherein position detection based on a capacitive method is performed by using the first conductive film and the second conductive film,
wherein position detection based on a resistive method is performed by detecting a potential of a position of contact between the second conductive film and the third conductive film,
wherein each of the separate areas of the first conductive film is connected to a current detecting unit, wherein only some but not all of the separate areas of the second conductive film are connected to a current detecting unit, and each of the separate areas of the second conductive film is connected to a potential detecting unit, and wherein the third conductive film is connected to a potential detecting unit.

8. The touch panel as claimed in claim 7, wherein each of the separate areas of the second conductive film is connected to a switch configured to generate a potential gradient in each of the separate areas of the second conductive film in the second direction, and the third conductive film is connected to a switch configured to generate a potential gradient in the third conductive film in the first direction.

9. The touch panel as claimed in claim 7, wherein the second conductive film is formed on one surface of a second transparent substrate, and the third conductive film is formed on one surface of a third transparent substrate, and wherein the one surface of the second transparent substrate and the one surface of the third transparent substrate face each other.

10. The touch panel as claimed in claim 9, wherein the third transparent substrate has a fourth conductive film formed on another surface thereof.

11. The touch panel as claimed in claim 7, wherein gaps between the separate areas of the second conductive film are narrower than gaps between the separate areas of the first conductive film.

* * * * *